(12) United States Patent
Konno et al.

(10) Patent No.: US 12,651,724 B2
(45) Date of Patent: Jun. 9, 2026

(54) ANALYSIS SYSTEM

(71) Applicant: Hitachi High-Tech Corporation, Tokyo (JP)

(72) Inventors: Azusa Konno, Tokyo (JP); Takashi Shidara, Tokyo (JP); Ichiro Fujimura, Tokyo (JP); Daiji Kirihata, Tokyo (JP); Hiromi Mise, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 486 days.

(21) Appl. No.: 18/027,501

(22) PCT Filed: Sep. 28, 2020

(86) PCT No.: PCT/JP2020/036694
§ 371 (c)(1),
(2) Date: Mar. 21, 2023

(87) PCT Pub. No.: WO2022/064707
PCT Pub. Date: Mar. 31, 2022

(65) Prior Publication Data
US 2023/0377836 A1 Nov. 23, 2023

(51) Int. Cl.
*H01J 37/22* (2006.01)
*G01B 9/0209* (2022.01)
(Continued)

(52) U.S. Cl.
CPC .......... *H01J 37/222* (2013.01); *H01J 37/244* (2013.01); *H01J 2237/2448* (2013.01); *H01J 2237/24578* (2013.01)

(58) Field of Classification Search
CPC .................. H01J 37/222; H01J 37/244; H01J 2237/2448; H01J 2237/24578;
(Continued)

(56) References Cited

U.S. PATENT DOCUMENTS

2015/0348751 A1* 12/2015 Brogden ............. H01J 37/3023
250/307
2017/0138725 A1* 5/2017 Kawada ................ H01J 37/222
(Continued)

FOREIGN PATENT DOCUMENTS

JP 8-7818 A 1/1996
JP 2001-201318 A 7/2001
(Continued)

OTHER PUBLICATIONS

International Search Report (PCT/ISA/210) issued in PCT Application No. PCT/JP2020/036694 dated Dec. 1, 2020 with English translation (five (5) pages).
(Continued)

*Primary Examiner* — Robert H Kim
*Assistant Examiner* — Laura Eloise Tandy
(74) *Attorney, Agent, or Firm* — Crowell & Moring LLP

(57) ABSTRACT

Depth information of a multilayer structure is acquired quickly and with high accuracy. An analysis system includes (a) acquiring a first captured image of a sample SAM viewed from a first direction by irradiating the sample SAM including a multilayer structure with an electron beam EB1 from the first direction, (b) acquiring a second captured image of the sample SAM viewed from a second direction by irradiating the sample SAM with the electron beam EB1 from the second direction, in which the second direction intersects the first direction, (c) acquiring depth information of the multilayer structure using information of the sample SAM including the first captured image, the second captured image, a number of layers of the multilayer structure, a thickness of one layer or a thickness of each layer of the multilayer structure, and a depth at which a first layer of the multilayer structure starts.

4 Claims, 23 Drawing Sheets

(51) Int. Cl.

| | |
|---|---|
| *G01B 9/04* | (2006.01) |
| *G01B 15/00* | (2006.01) |
| *G01B 15/04* | (2006.01) |
| *G01N 23/225* | (2018.01) |
| *H01J 37/244* | (2006.01) |
| *H01J 37/26* | (2006.01) |

(58) Field of Classification Search
CPC ..... H01J 2237/20207; H01J 2237/2611; H01J 37/26; G01B 15/04; G01B 15/00; G01B 9/0209; G01B 9/04; G01B 2210/56; H01L 22/12; G01N 23/225; G01N 2223/6116; G01N 2223/633

See application file for complete search history.

(56) References Cited

U.S. PATENT DOCUMENTS

| | | | |
|---|---|---|---|
| 2020/0043698 A1 | 2/2020 | Hartley | |
| 2022/0392793 A1* | 12/2022 | Buxbaum | ............. H01J 37/222 |

FOREIGN PATENT DOCUMENTS

| | | |
|---|---|---|
| TW | 201600828 A | 1/2016 |
| TW | 202032114 A | 9/2020 |
| WO | WO 2016/002341 A1 | 1/2016 |

OTHER PUBLICATIONS

Japanese-language Written Opinion (PCT/ISA/237) issued in PCT Application No. PCT/JP2020/036694 dated Dec. 1, 2020 (three (3) pages).

Chinese-language Office Action issued in Taiwanese Application No. 110132556 dated Jul. 11, 2022 with English translation (10 pages).

* cited by examiner

[FIG. 1]
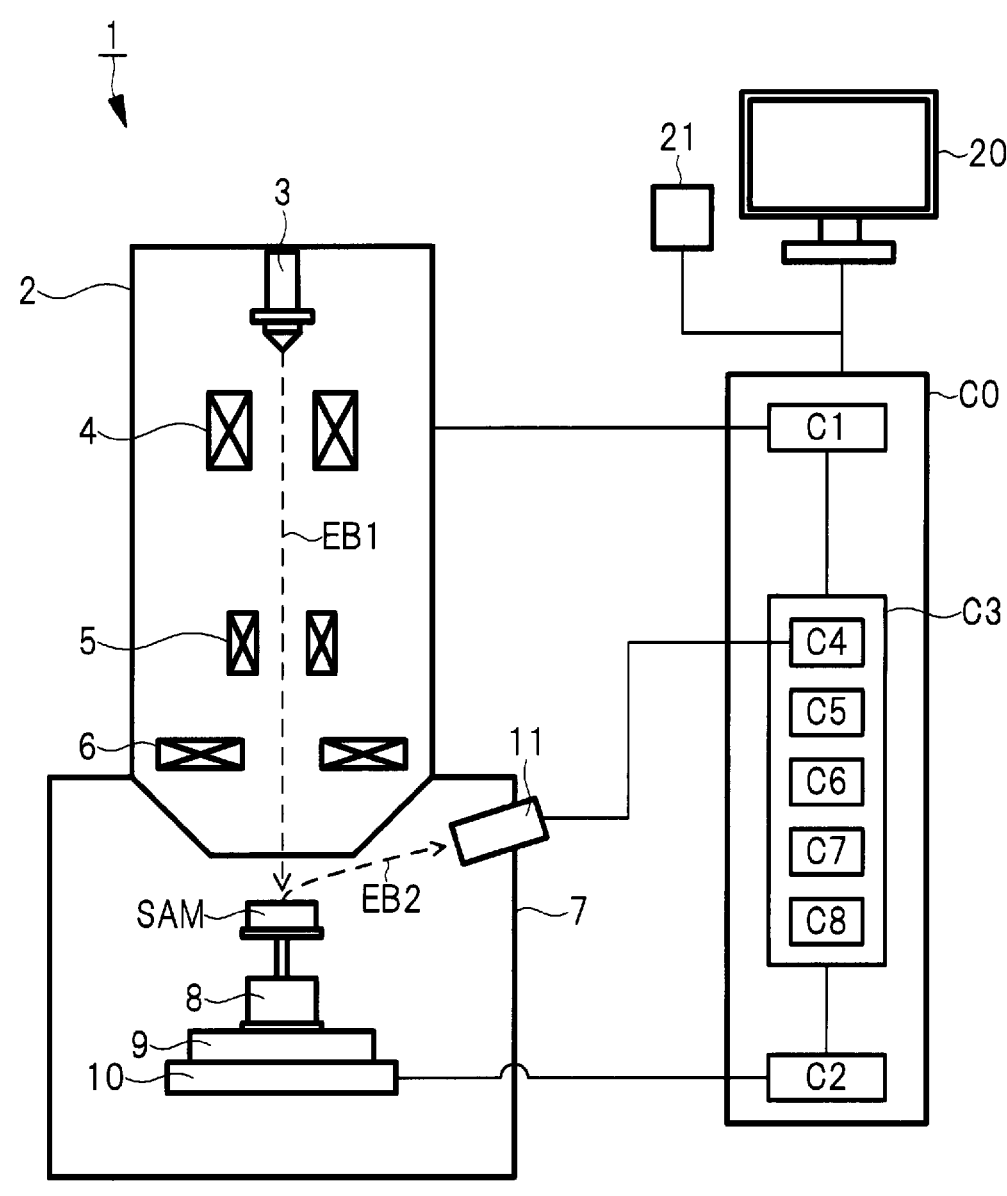

[FIG. 3]
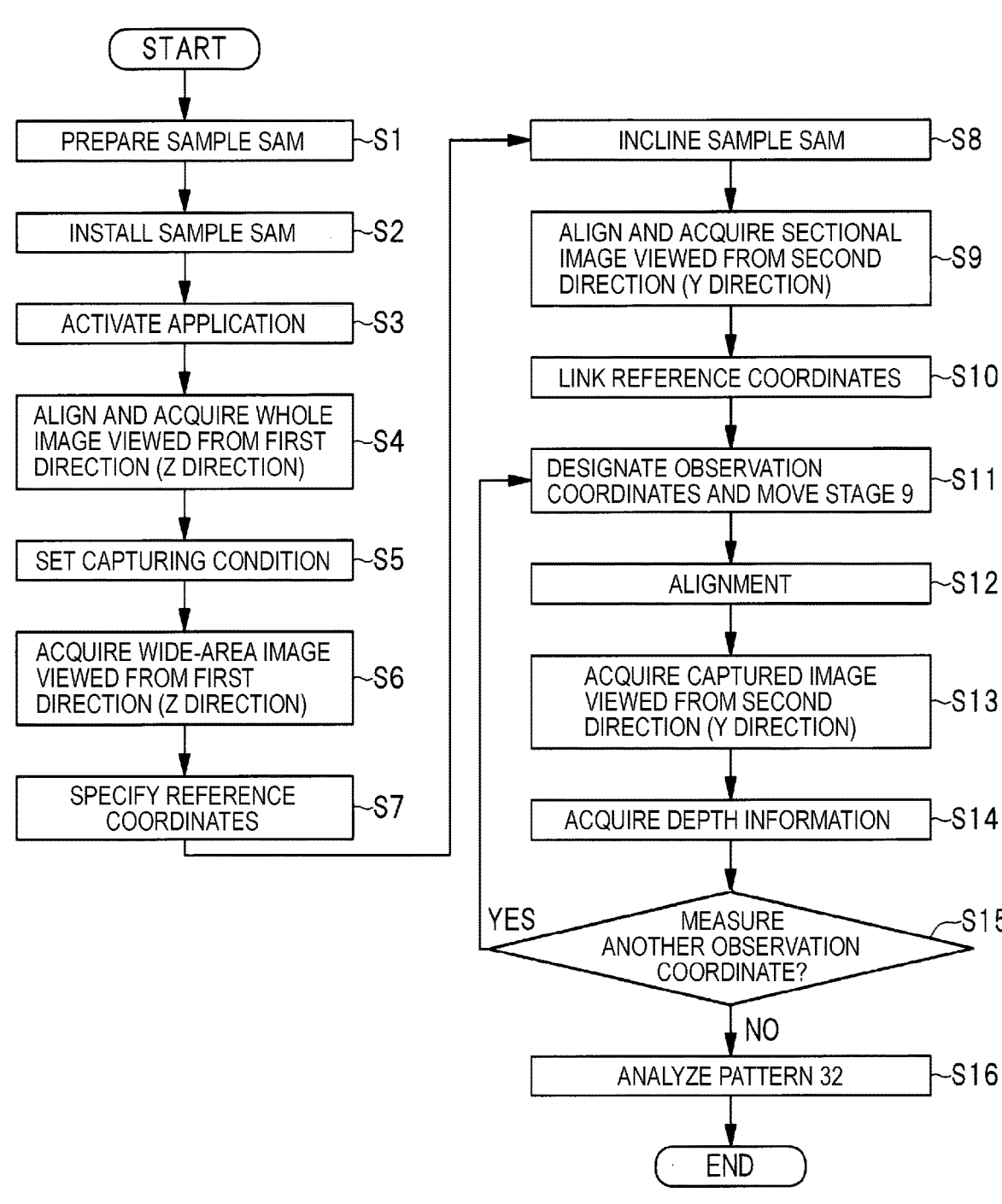

[FIG. 4]
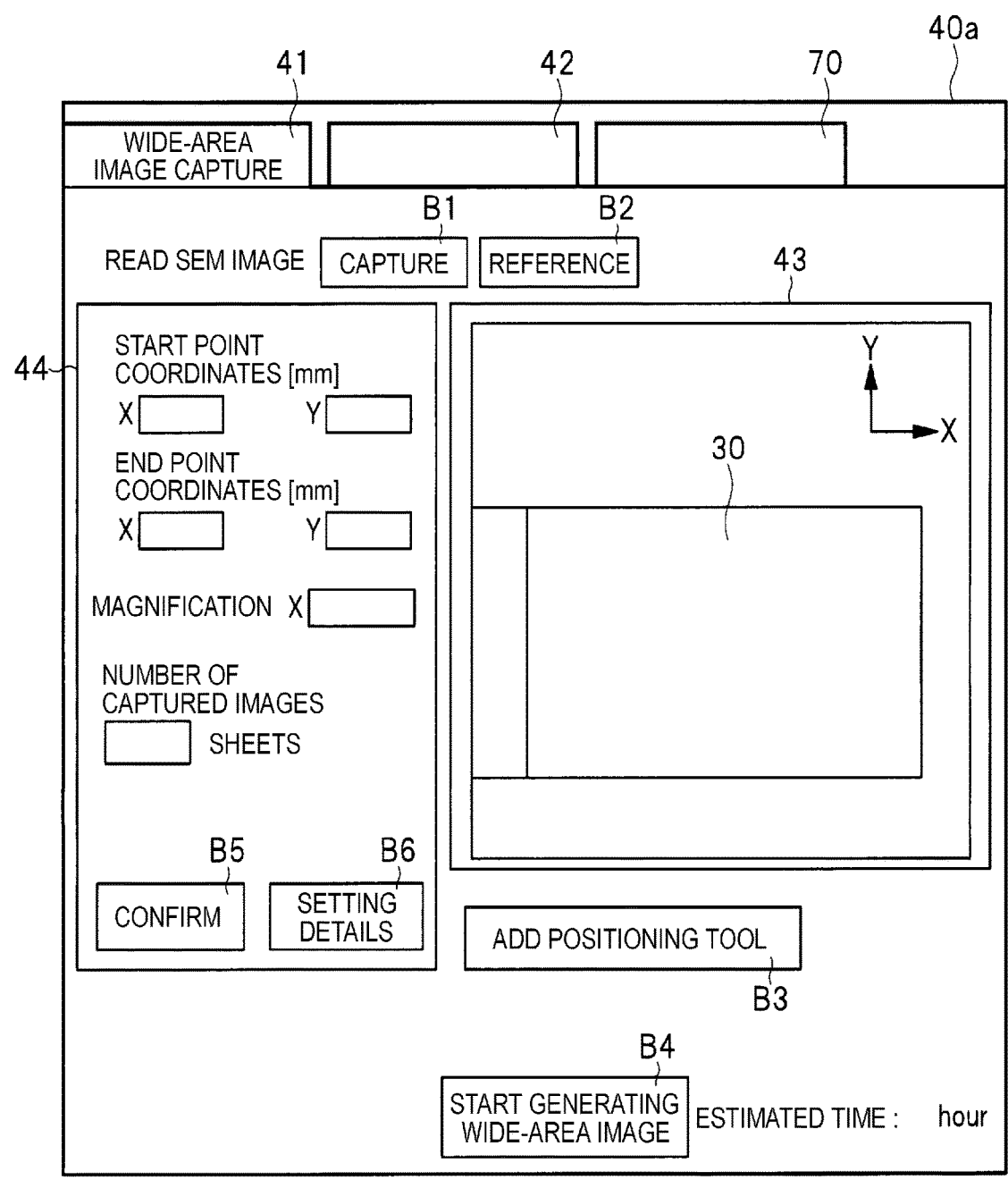

[FIG. 5]
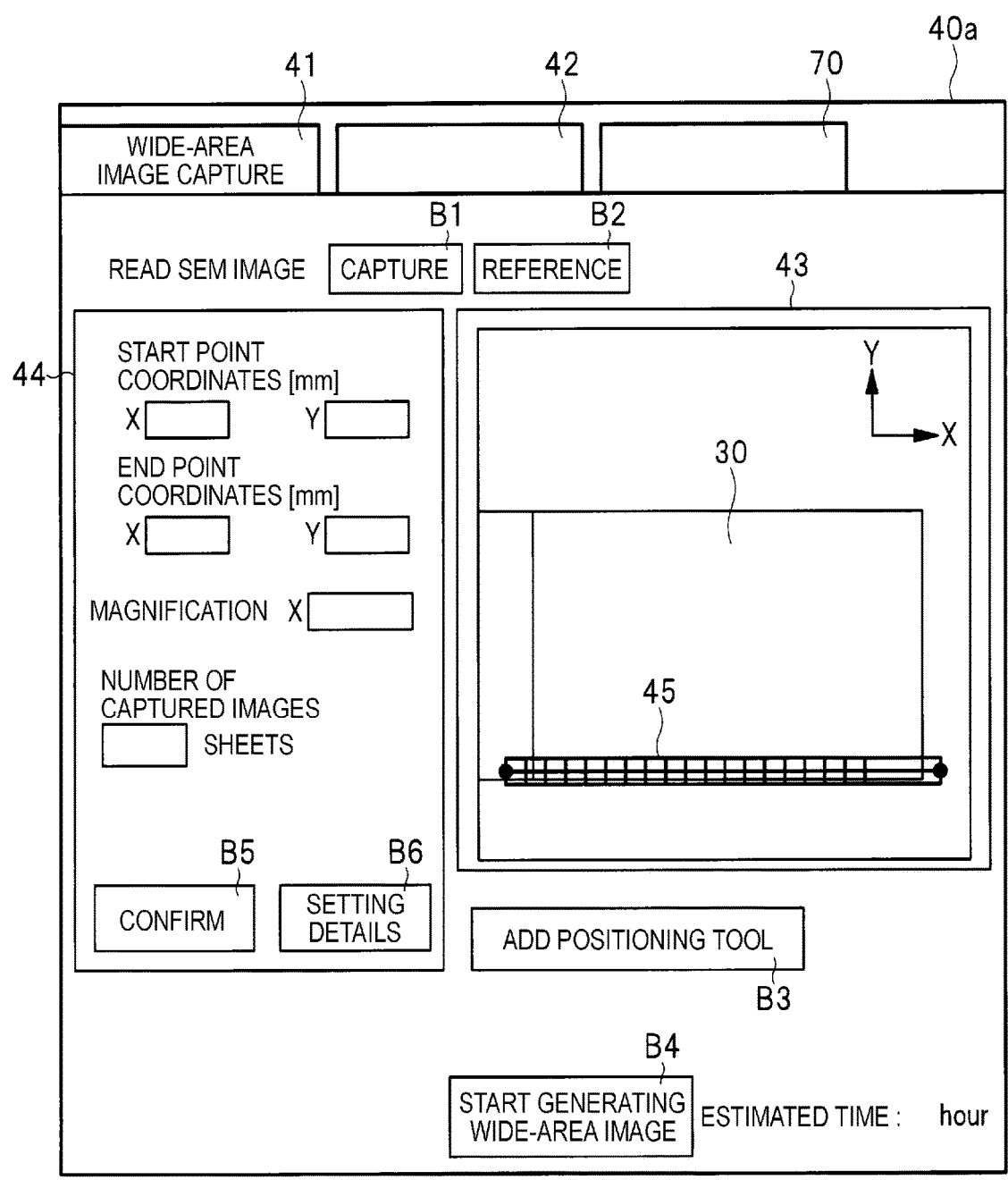

[FIG. 6]
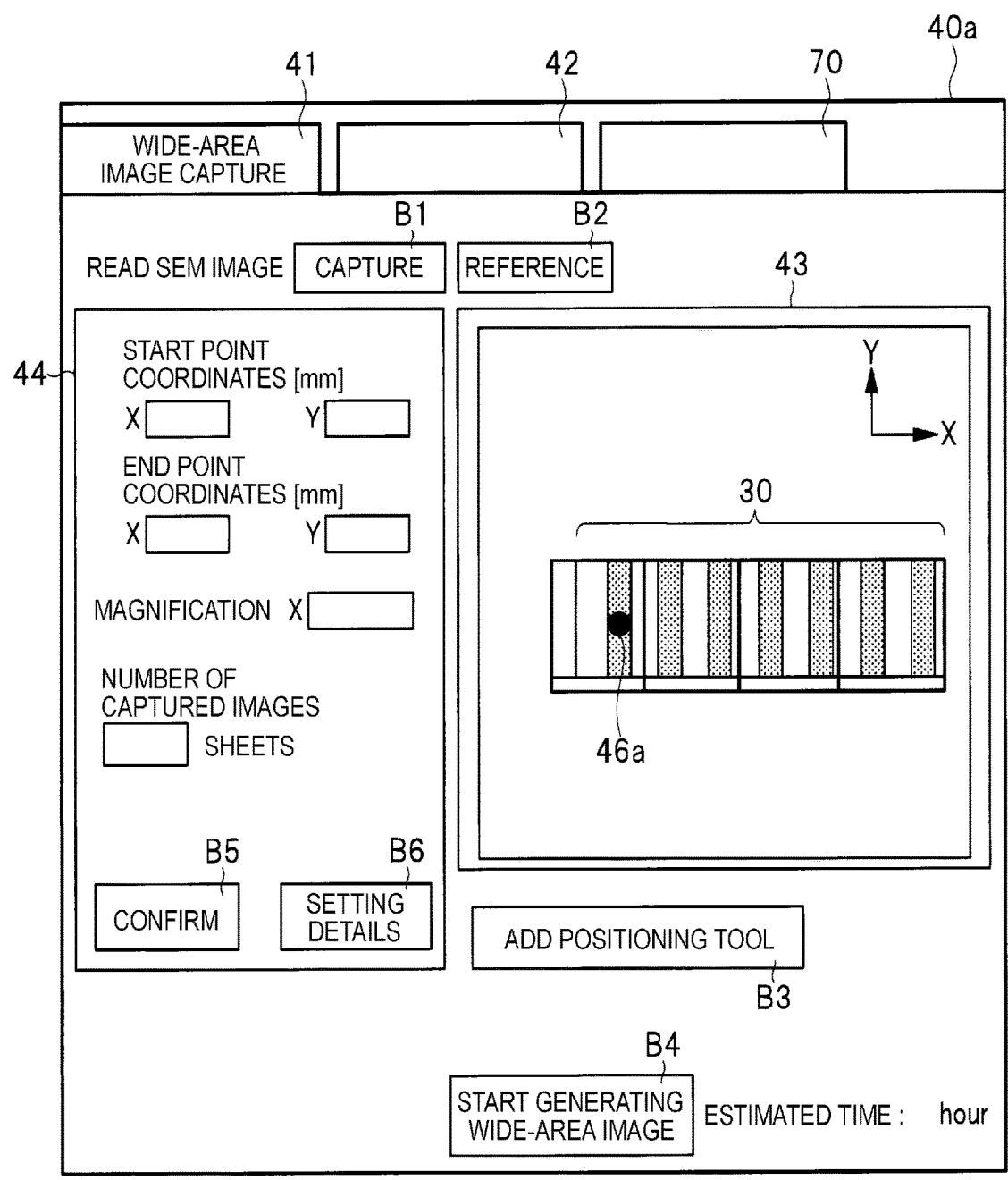

[FIG. 7]
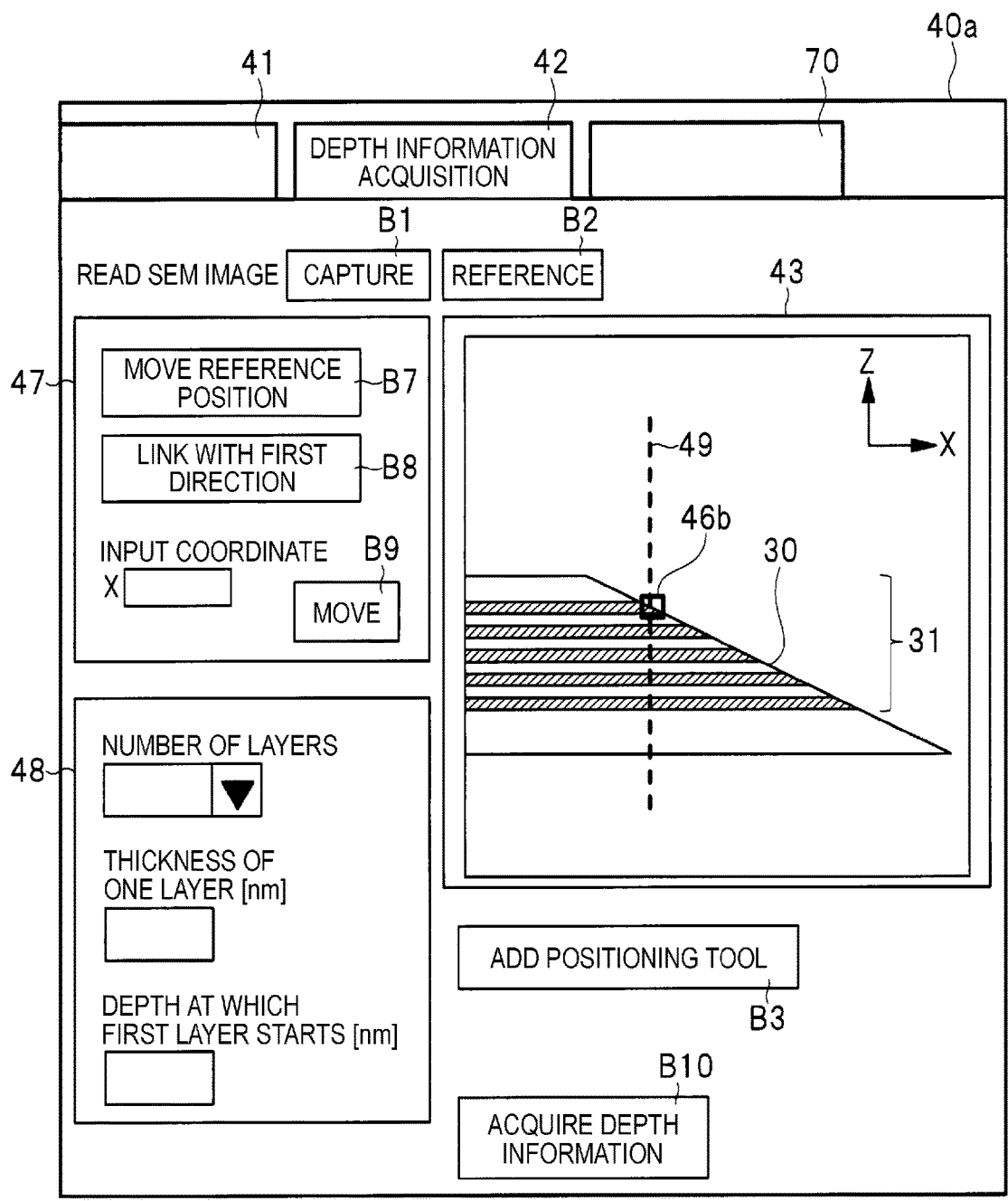

[FIG. 8]
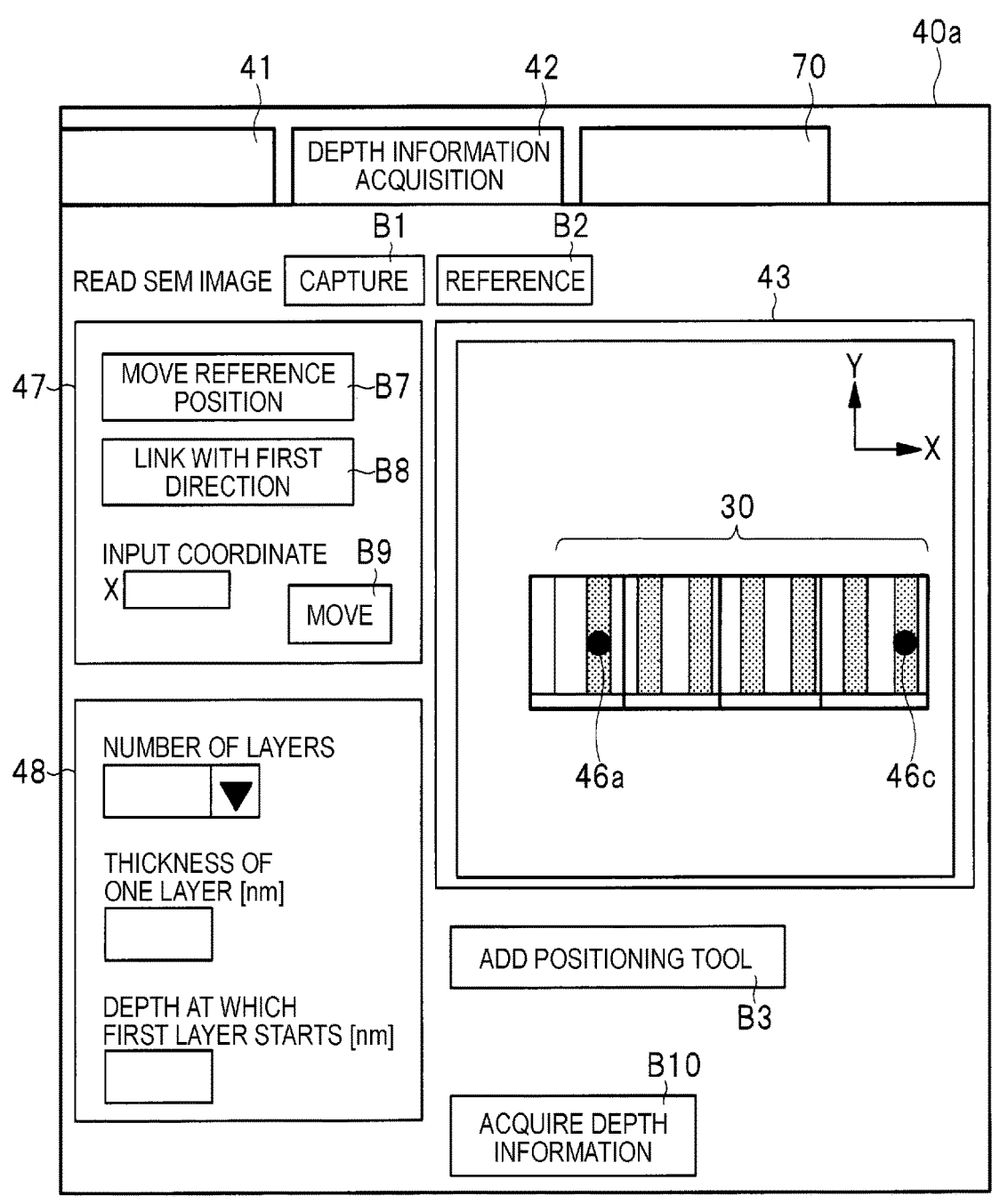

[FIG. 9]
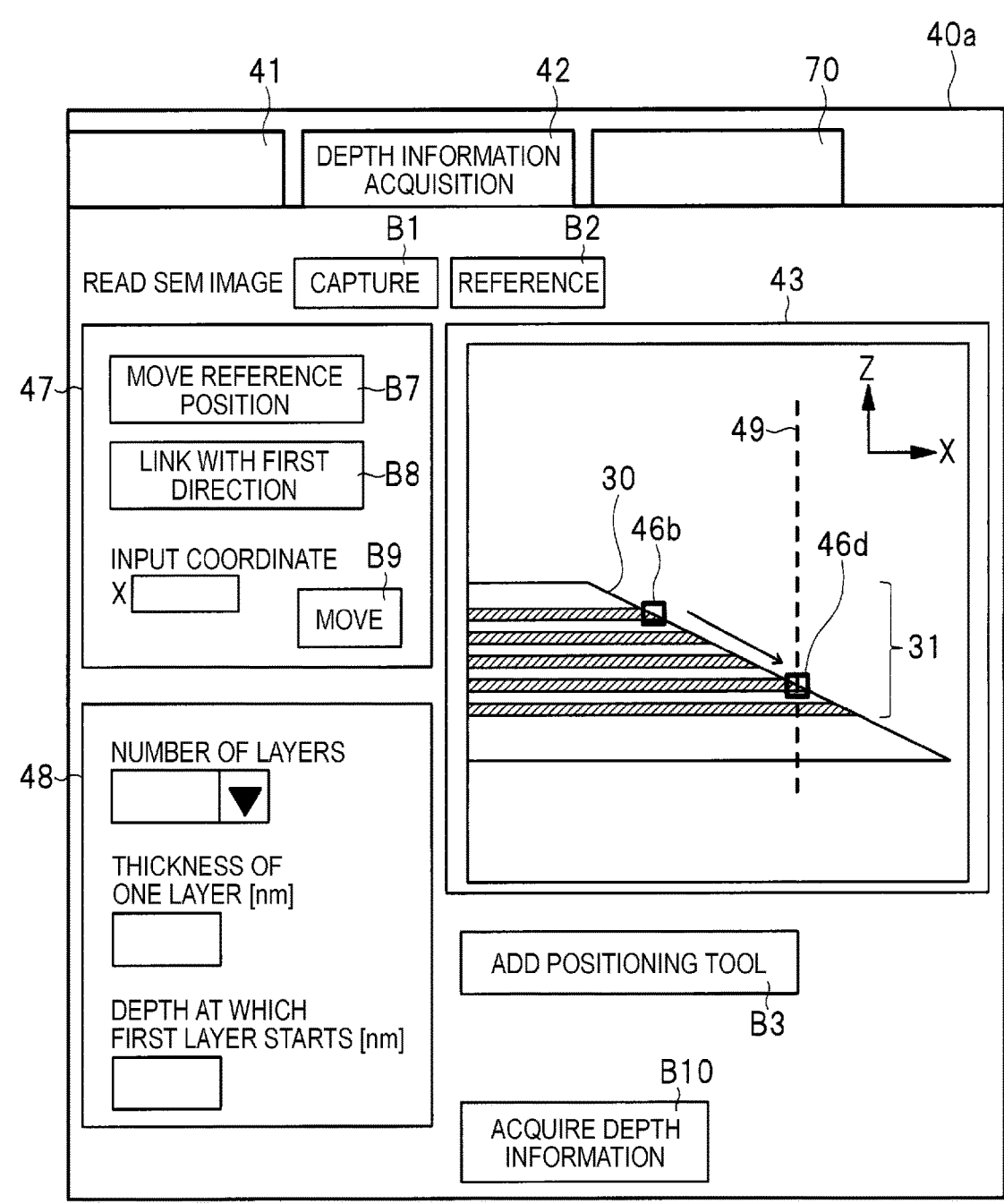

[FIG. 10]

| No. | FIRST DIRECTION IMAGE FILE NAME | SECOND DIRECTION IMAGE FILE NAME | COORDINATE | | DEPTH FROM REFERENCE COORDINATES | NUMBER OF LAYERS FROM REFERENCE COORDINATE | DEPTH FROM UPPER SURFACE OF SAMPLE | NUMBER OF LAYERS FROM UPPER SURFACE OF SAMPLE | IMAGE FILE NAME FOR PATTERN ANALYSIS |
|---|---|---|---|---|---|---|---|---|---|
| | | | X | Y | | | | | |
| 1 | | | | | | | | | |
| 2 | | | | | | | | | |
| 3 | | | | | | | | | |
| 4 | | | | | | | | | |

[FIG. 11]
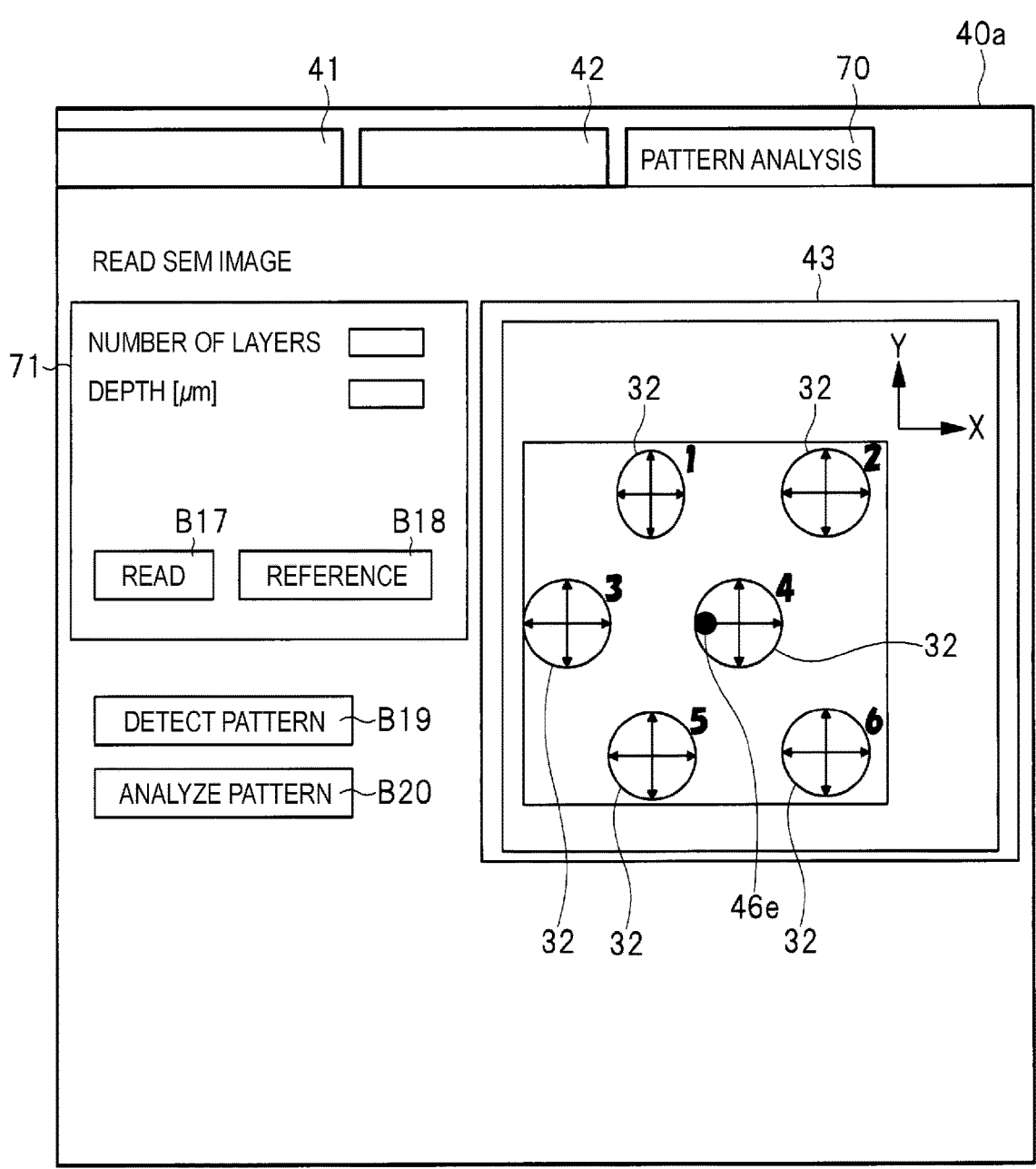

[FIG. 12]
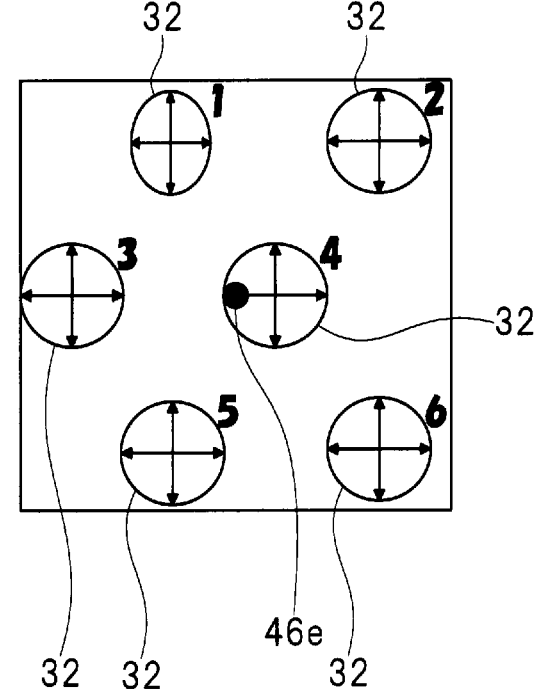
| PATTERN NO. | MAJOR AXIS DIAMETER | MINOR AXIS DIAMETER | AVERAGE DIAMETER | CIRCULARITY |
|---|---|---|---|---|
| 1 | | | | LOW |
| 2 | | | | HIGH |
| 3 | | | | HIGH |
| 4 | | | | HIGH |
| 5 | | | | HIGH |
| 6 | | | | HIGH |

[FIG. 13]
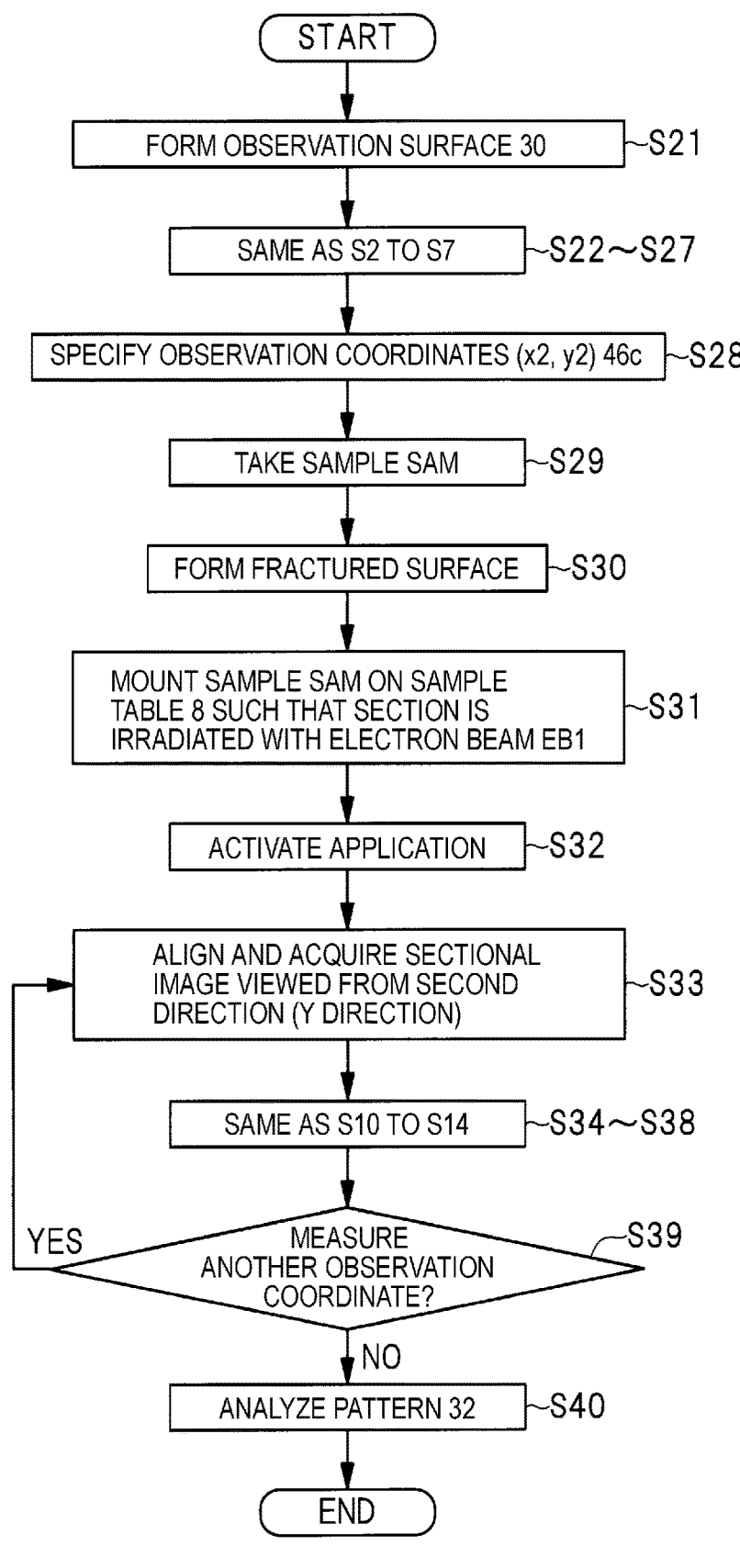

[FIG. 14]
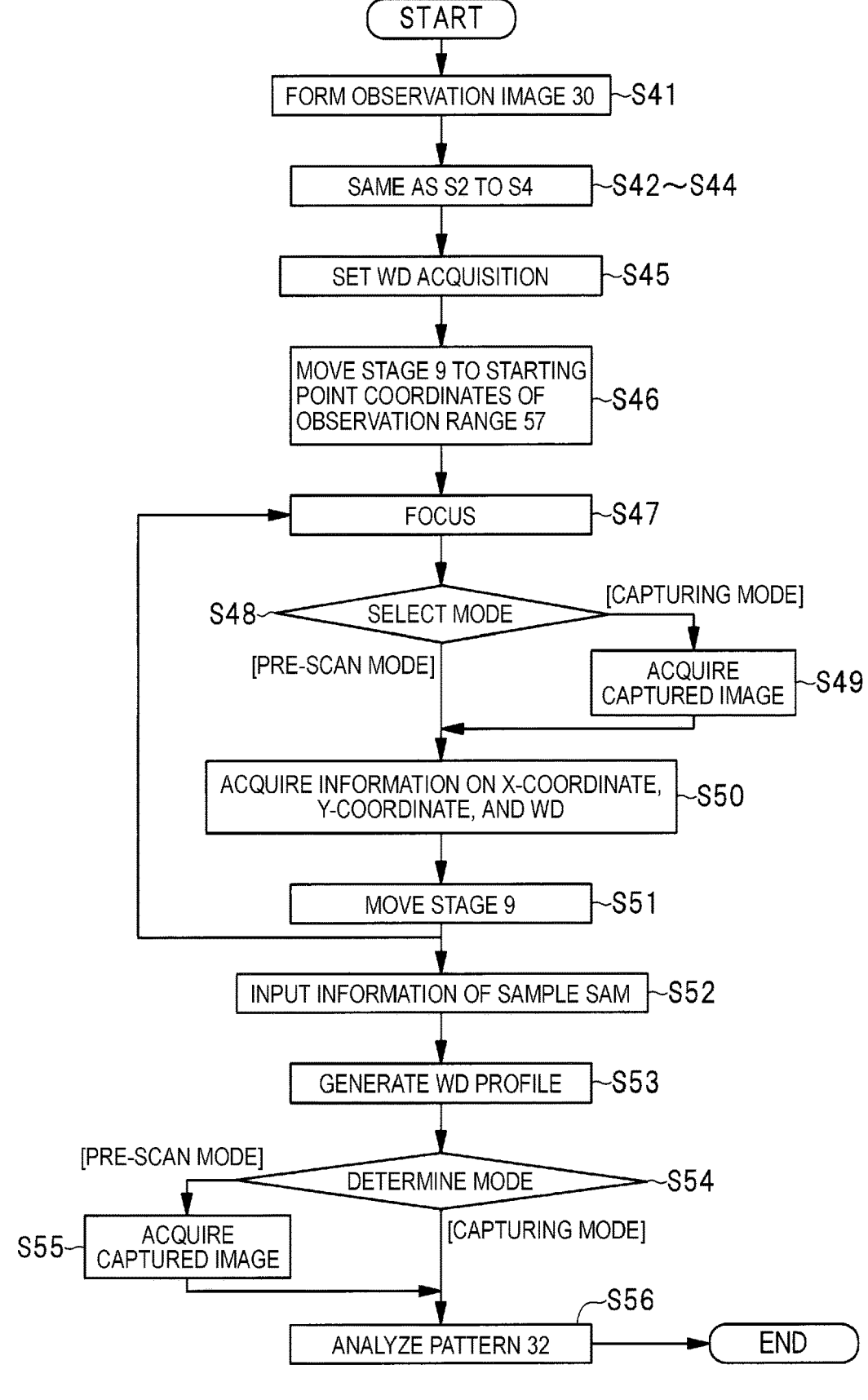

[FIG. 15]
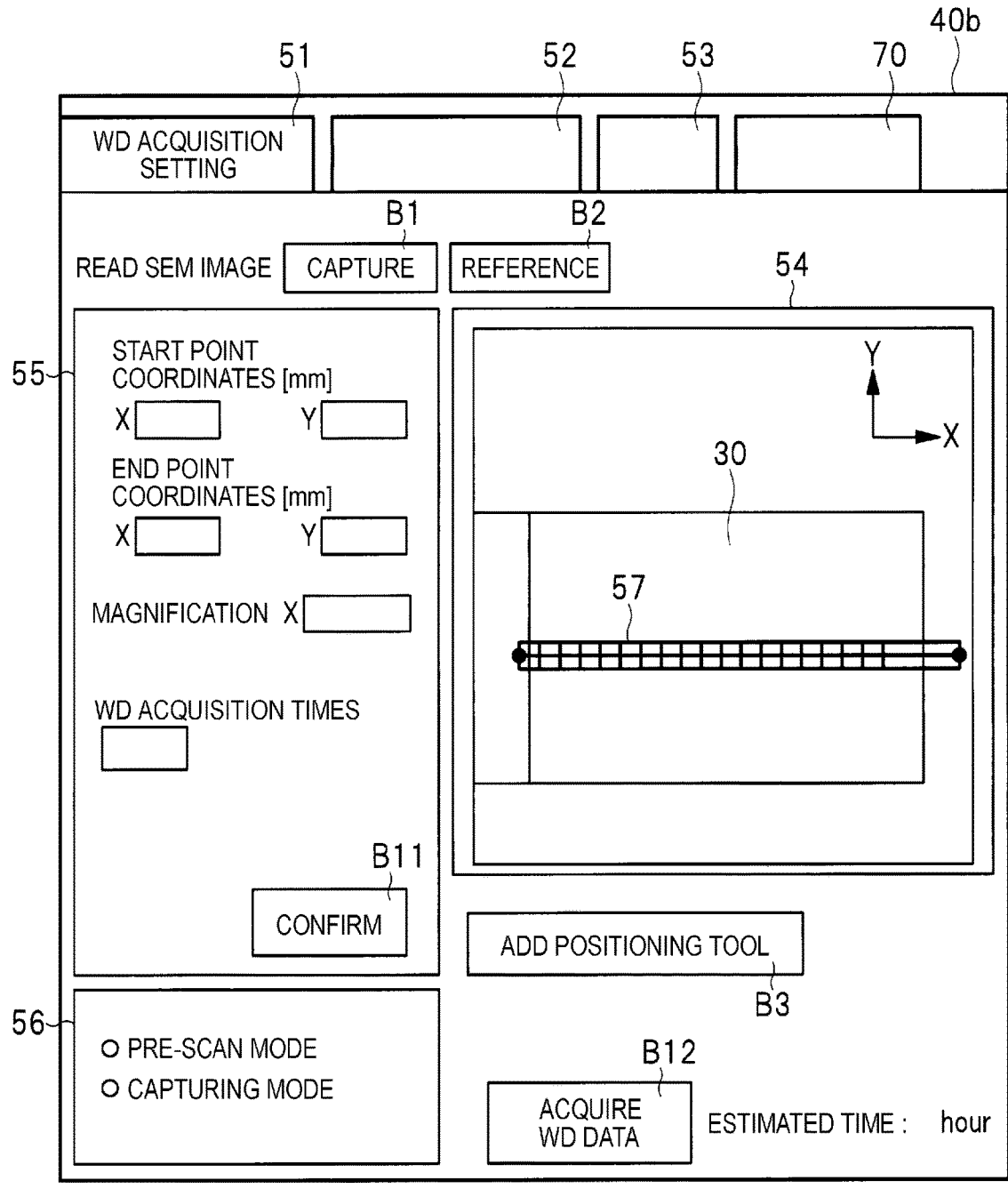

[FIG. 16]
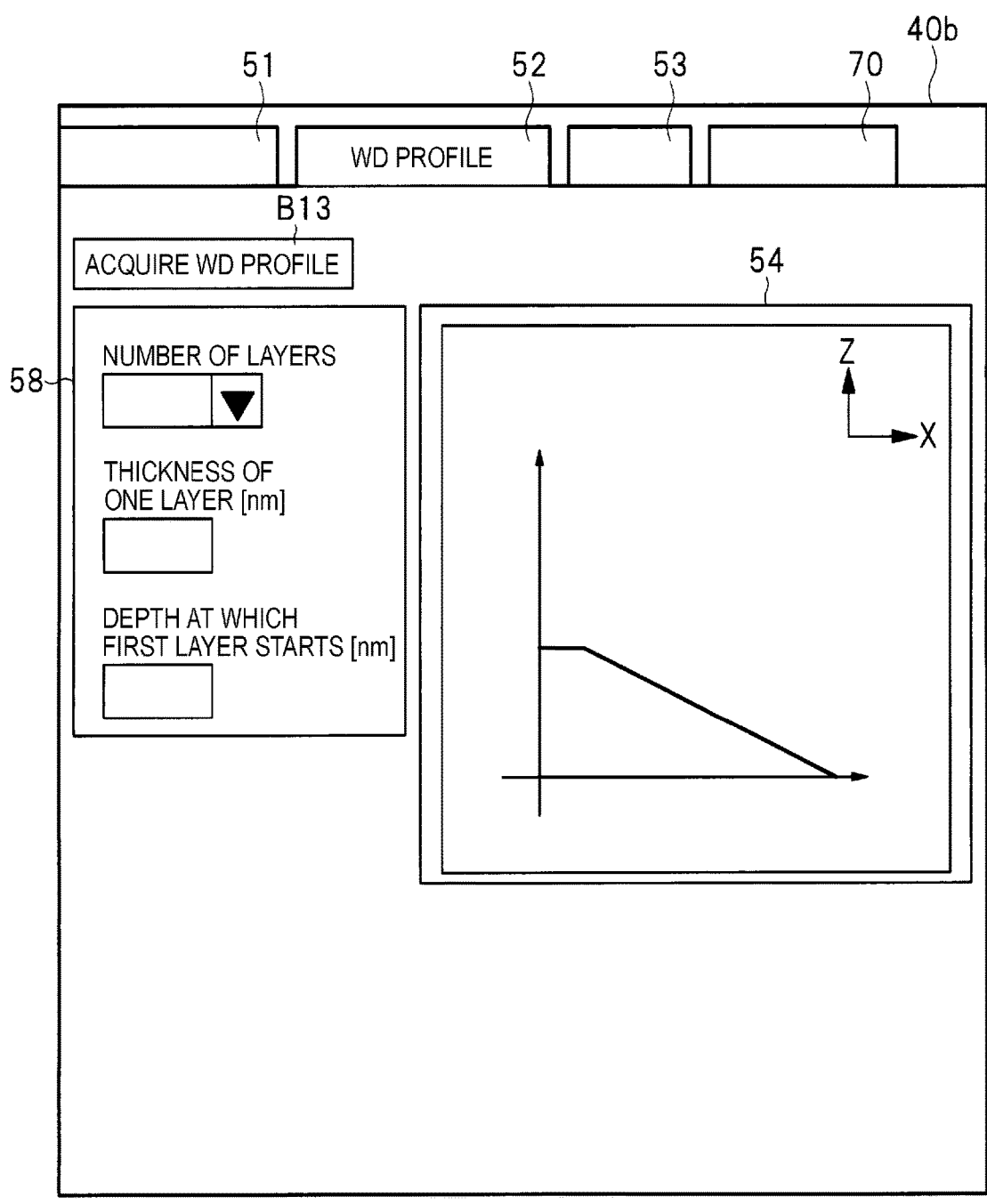

[FIG. 17]
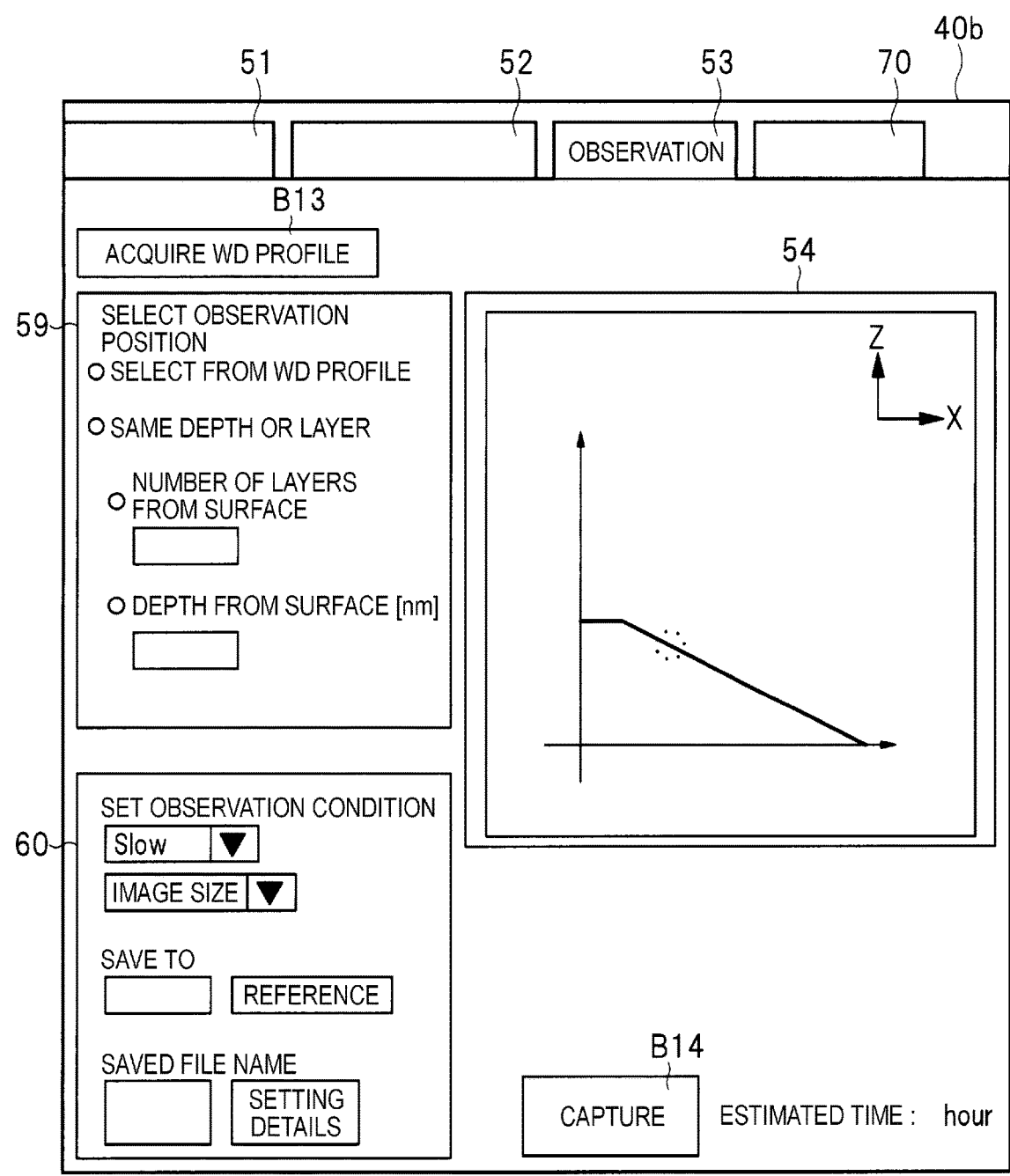

[FIG. 18]

| No. | FILE NAME | COORDINATE | | | DEPTH FROM UPPER SURFACE OF SAMPLE | NUMBER OF LAYERS FROM UPPER SURFACE OF SAMPLE | IMAGE FILE NAME FOR PATTERN ANALYSIS |
|-----|-----------|-----|-----|-----|-----|-----|-----|
| | | X | Y | WD | | | |
| 1 | | | | | | | |
| 2 | | | | | | | |
| 3 | | | | | | | |
| 4 | | | | | | | |

[FIG. 19]
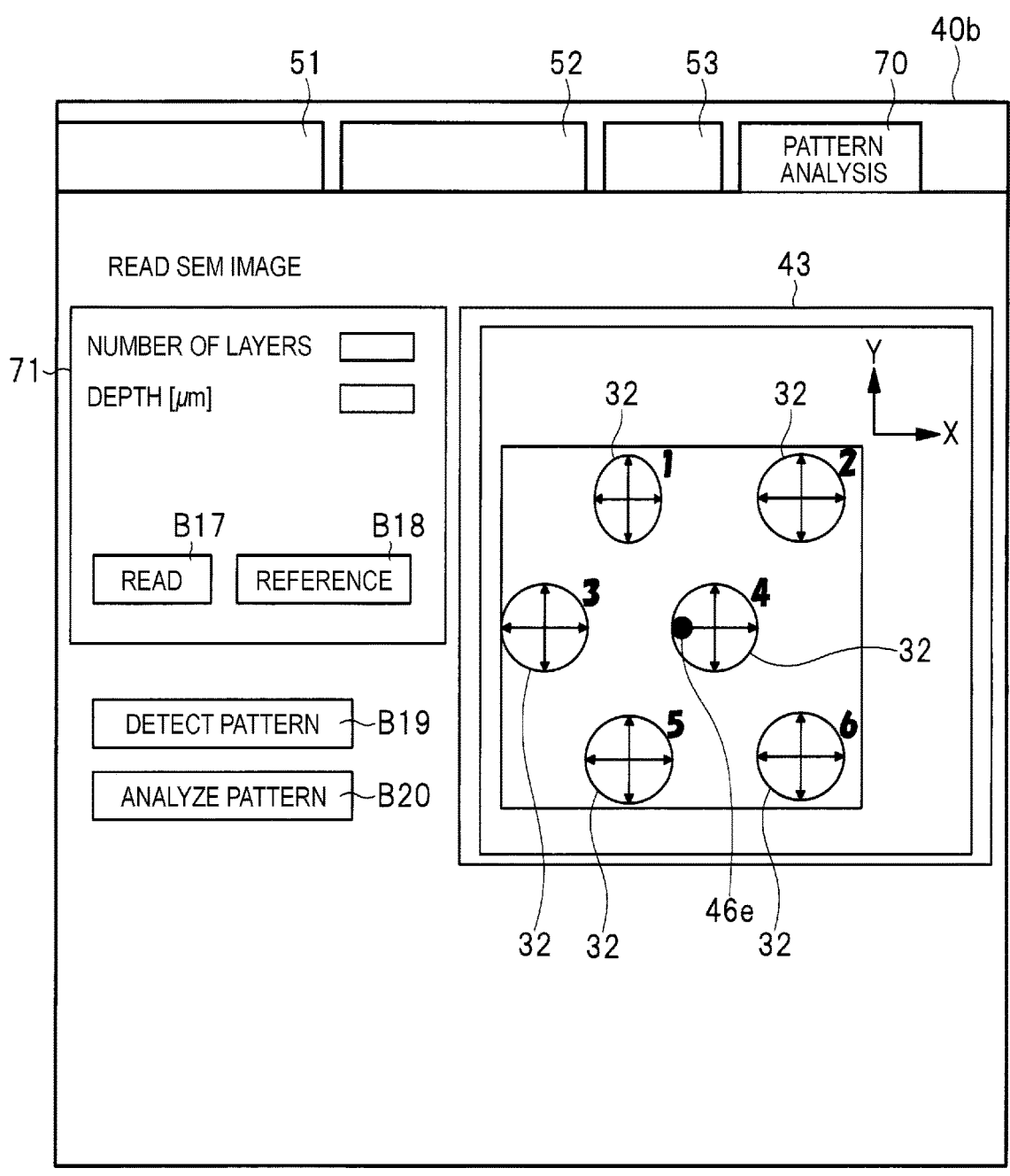

[FIG. 20]
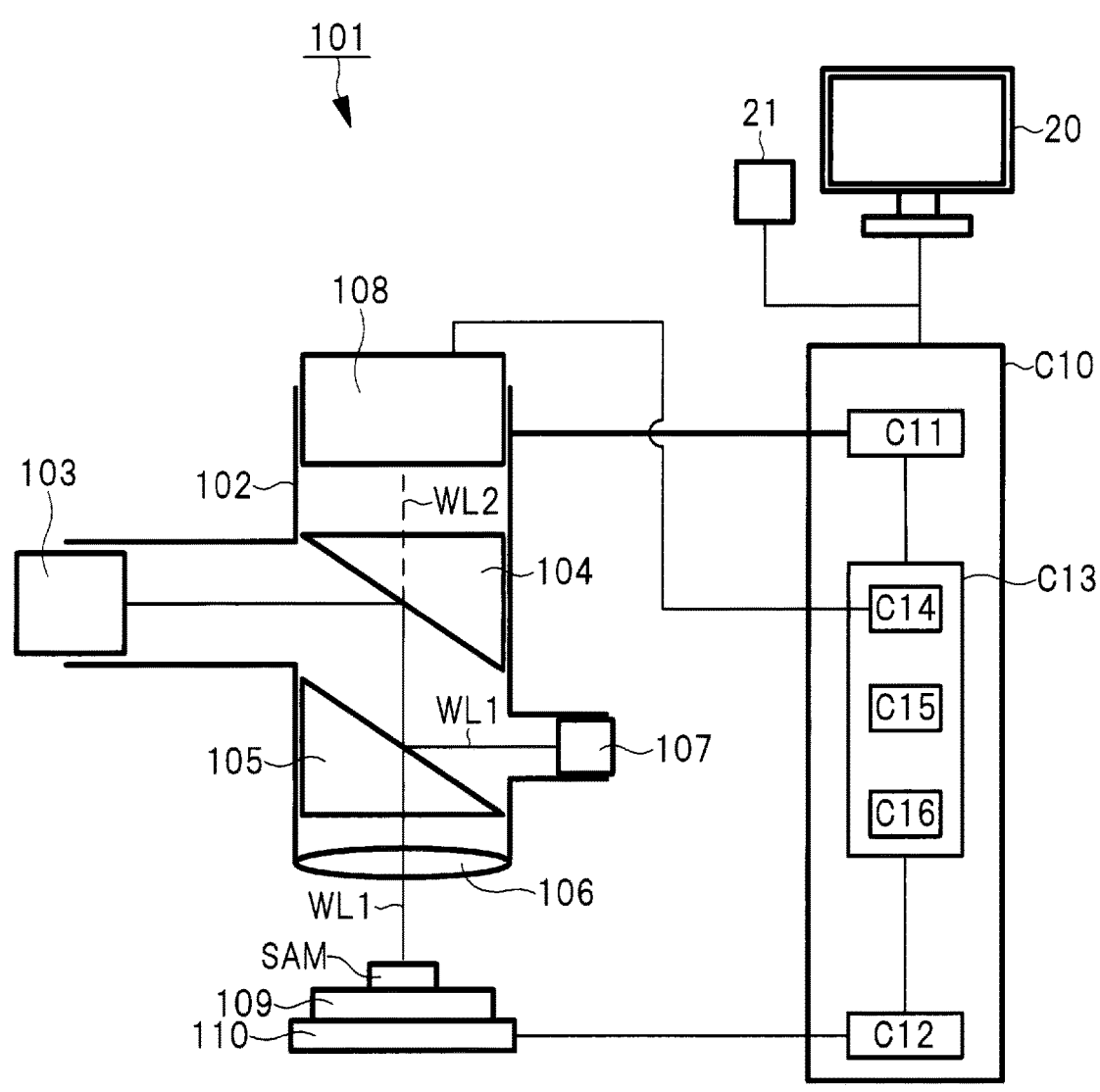

[FIG. 21]
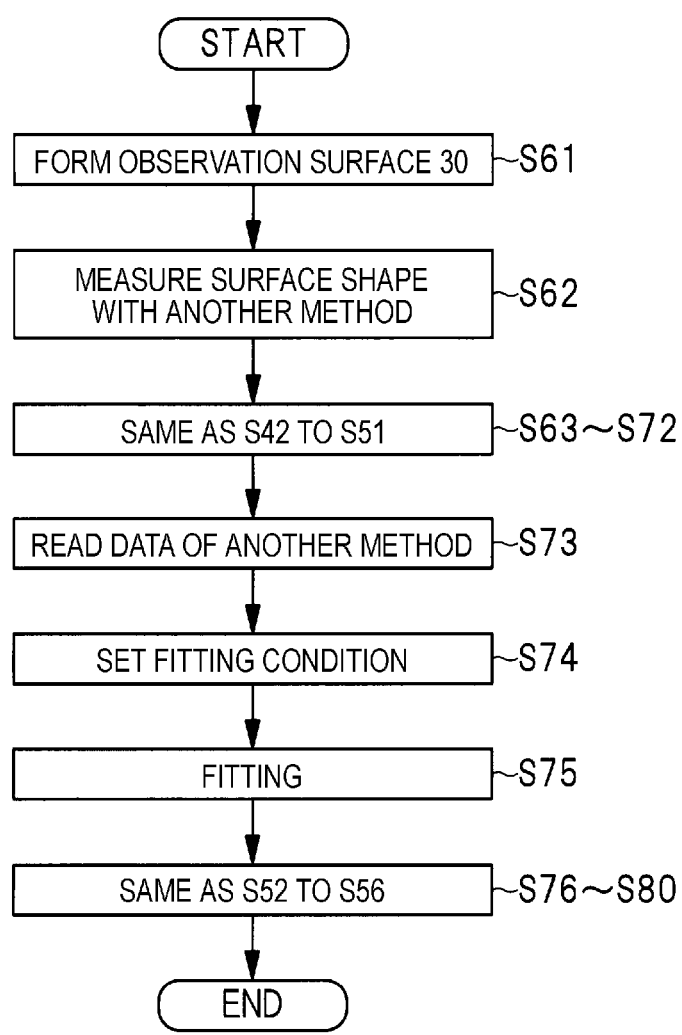

[FIG. 22]
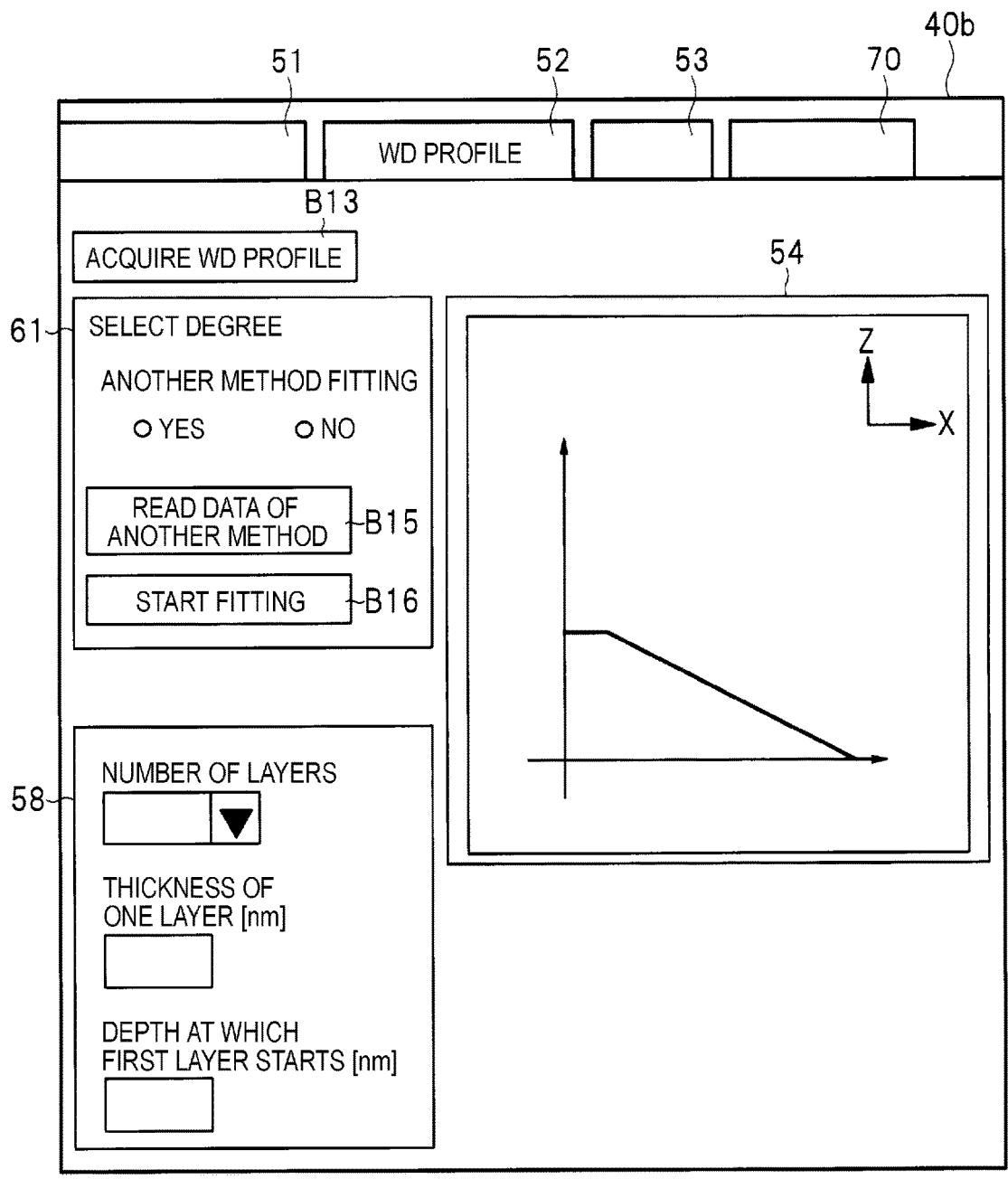

ANALYSIS SYSTEM

TECHNICAL FIELD

The present invention relates to an analysis system, and more particularly, to an analysis system capable of acquiring depth information of a multilayer structure included in a sample.

BACKGROUND ART

As a background art in this technical field, there is disclosed in WO2016/002341A (PTL 1).

In recent years, semiconductor devices have been progressively miniaturized. In particular, the semiconductor devices in 3D structure combined with stacking technology are making dramatically progressed high density and large capacity. In the manufacturing process of semiconductor devices, it is necessary to evaluate the degree of completion of the pattern in each layer in order to control the dimensions of a multi-layered pattern. In order to improve the quality of semiconductor devices, it is essential to form a vertical and uniform pattern, and rapid and high-accuracy evaluation of pattern shapes is required.

As a current evaluation method, there is a method of obtaining pattern depth information by observing a sample while scraping the sample little by little with a Focused Ion Beam (FIB), a method of obtaining the pattern depth information by observing a sample generated by mechanical polishing with a charged particle beam device and predicting the inclination angle of the polished surface, and the like.

For example, PTL 1 discloses a technique of processing a sample into a tapered shape using FIB, acquiring a surface observation image of an inclined surface formed as a result using an electron microscope, and calculating a depth of a pattern based on a starting position of a downward inclined surface, a scanning distance of an electron beam and an inclination angle.

CITATION LIST

Patent Literature

PTL 1: WO2016/002341A

SUMMARY OF INVENTION

Technical Problem

The method using the FIB enables highly accurate pattern evaluation, but has problems such as a narrow processing area, long evaluation time, and difficulty in re-acquiring data. In addition, the method of predicting the inclination angle of the polished surface enables rapid evaluation, but since the depth information of the pattern can be calculated only by prediction, there is a problem of low accuracy of the evaluation value of the pattern, and the like.

In other words, there is a need for a technology capable of quickly and accurately acquiring depth information of a multilayer structure without using the FIB.

Other issues and novel features will become apparent from the description of the present specification and the accompanying drawings.

Solution to Problem

The outline of a certain representative example of the embodiments disclosed in the present application will be briefly described below.

According to an embodiment, an analysis system includes (a) acquiring a first captured image of a sample viewed from a first direction by irradiating the sample including a multilayer structure with an electron beam from the first direction, (b) acquiring a second captured image of the sample viewed from a second direction by irradiating the sample with the electron beam from the second direction, in which the second direction intersects the first direction, and (c) acquiring depth information of the multilayer structure using information of the sample including the first captured image, the second captured image, a number of layers of the multilayer structure, a thickness of one layer or a thickness of each layer of the multilayer structure, and a depth at which a first layer of the multilayer structure starts.

In addition, according to an embodiment, an analysis system includes (a) acquiring a first captured image of a sample viewed from a first direction by irradiating the sample including a multilayer structure with an electron beam from the first direction, (b) specifying an observation range in the first captured image, (c) performing focusing of the electron beam in the first direction using an objective lens on a plurality of portions of the sample within the specified observation range, (d) acquiring distances between the objective lens and focus positions at the plurality of portions of the sample based on a result of the focusing in the step (c) and generating a WD profile by graphing the distances, and (e) acquiring depth information of the multilayer structure by comparing, with the WD profile, information of the sample including a number of layers in the multilayer structure, a thickness of one layer or a thickness of each layer in the multilayer structure, and a depth at which a first layer of the multilayer structure starts.

Advantageous Effects of Invention

According to an embodiment, depth information of a multilayer structure can be acquired rapidly and with high accuracy.

BRIEF DESCRIPTION OF DRAWINGS

FIG. 1 is a schematic view illustrating an example of a charged particle beam device in a first embodiment.

FIG. 3 is a flowchart of an analysis system in the first embodiment.

FIG. 4 is a schematic diagram showing an operation screen in the first embodiment.

FIG. 5 is a schematic diagram showing the operation screen in the first embodiment.

FIG. 6 is a schematic diagram showing the operation screen in the first embodiment.

FIG. 7 is a schematic diagram showing the operation screen in the first embodiment.

FIG. 8 is a schematic diagram showing the operation screen in the first embodiment.

FIG. 9 is a schematic diagram showing the operation screen in the first embodiment.

FIG. 10 illustrates a record table showing an example of each piece of recorded information in the first embodiment.

FIG. 11 is a schematic diagram showing the operation screen in the first embodiment.

FIG. 12 shows a captured image of pattern analysis and a record table in the first embodiment.

FIG. 13 is a flowchart of an analysis system in a second embodiment.

FIG. 14 is a flowchart of an analysis system in a third embodiment.

FIG. 15 is a schematic diagram showing an operation screen in the third embodiment.

FIG. 16 is a schematic diagram showing an operation screen in the third embodiment.

FIG. 17 is a schematic diagram showing an operation screen in the third embodiment.

FIG. 18 illustrates a record table showing an example of each piece of recorded information in the third embodiment.

FIG. 19 is a schematic diagram showing the operation screen in the first embodiment.

FIG. 20 is a schematic diagram showing an example of a surface shape measuring device in a fourth embodiment.

FIG. 21 is a flowchart of an analysis system in the fourth embodiment.

FIG. 22 is a schematic diagram showing an operation screen in the fourth embodiment.

DESCRIPTION OF EMBODIMENTS

Figure 2A:
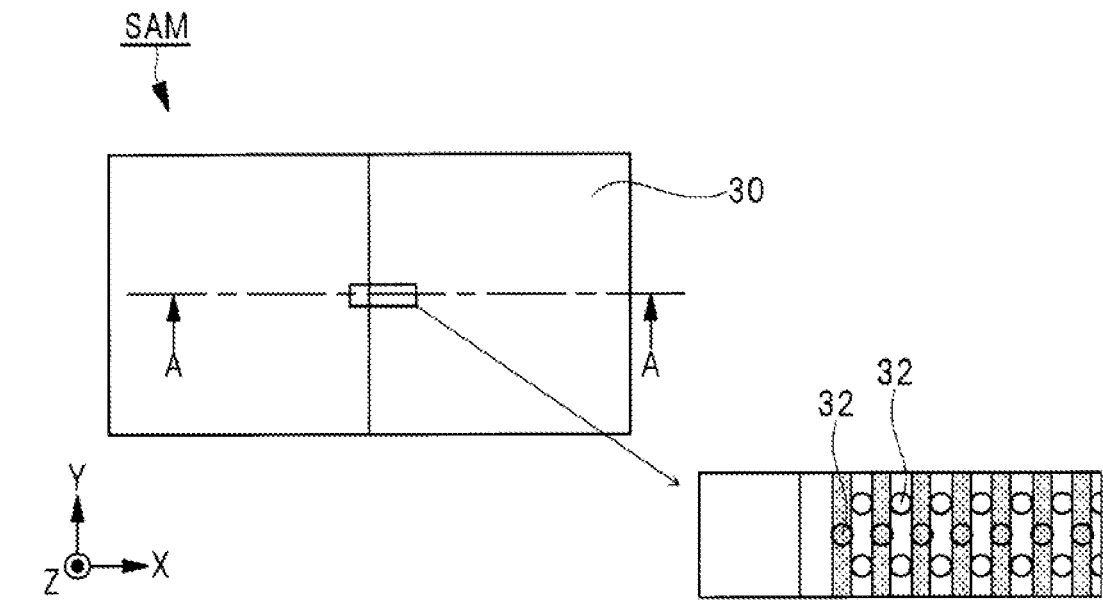
FIG. 2A is a plan view of a sample in the first embodiment.

Hereinbelow, embodiments will be described in detail with reference to the drawings. In all the drawings for explaining the embodiments, the members having the same functions are designated by the same reference numerals, and the repeated description thereof will be omitted. Further, in the following embodiments, the description of the same or similar components is not repeated in principle except when it is particularly necessary.

In addition, the X-, Y-, and Z-directions described herein intersect with each other and are orthogonal to each other. In this application, the Z direction may be described as a vertical direction, height direction, or thickness direction of a structure.

First Embodiment

Hereinafter, an analysis system in the first embodiment will be described. First, a charged particle beam device 1 that forms a part of the analysis system will be described with reference to FIG. 1. In FIG. 1, a scanning electron microscope (SEM) is illustrated as the charged particle beam device 1, for example.

<Construction of Charged Particle Beam Device>

The charged particle beam device 1 shown in FIG. 1 is a device for analyzing (observing, measuring) a sample SAM by irradiating the sample SAM placed in a sample chamber 7 with an electron beam EB1 from an electron gun 3 provided inside a lens barrel 2.

The charged particle beam device 1 includes the sample chamber 7, and the lens barrel 2 attached to the sample chamber 7 and forming an electron beam column. The lens barrel 2 includes the electron gun 3 capable of irradiating the electron beam EB1, a condenser lens 4 for focusing the electron beam EB1, a deflection coil 5 for scanning the electron beam EB1, an objective lens 6 for focusing the electron beam EB1, and the like.

A sample table 8 (holder) for mounting the sample SAM, a stage 9 for installing the sample table 8, a stage control device 10, a detector 11, and the like are provided inside the sample chamber 7. Although not shown, the sample chamber 7 includes an inlet/outlet port.

At the time of analysis of the sample SAM, the sample table 8 on which the sample SAM is mounted is transferred into the sample chamber 7 via the inlet/outlet and placed on the stage 9. Further, when taking out the sample SAM, the sample table 8 on which the sample SAM is mounted is transferred to the outside of the sample chamber 7 via the inlet/outlet.

The stage control device 10 is connected to the stage 9 and can change the position and orientation of the stage 9. The displacement of the stage 9 changes the position and orientation of the sample SAM.

The stage control device 10 includes an X-Y-axis drive mechanism capable of driving in directions parallel to the mounting surface of the charged particle beam device 1, a Z-axis drive mechanism capable of driving in a direction perpendicular to the mounting surface, an R-axis drive mechanism capable of driving in a rotational direction, and a T-axis drive mechanism capable of driving in a direction inclined with respect to the X-Y plane. Each of these drive mechanisms is a mechanism used to analyze any portion of the sample SAM and the sample table 8 placed on the stage 9. As a result, the part of the sample SAM to be analyzed is moved to the center of the field of view and inclined in any direction.

The detector 11 is capable of detecting a secondary electron EM2 emitted from the sample SAM, when the sample SAM is irradiated with the electron beam EB1 during analysis of the sample SAM. It is to be noted that the detector 11 may be provided inside the sample chamber 7 or may be provided inside the lens barrel 2.

In addition, the charged particle beam device 1 includes an integrated control unit C0, and includes a display device 20 and an operation device 21 which are outside or inside the charged particle beam device 1 and electrically connected to the integrated control unit C0. For example, the display device 20 is a display, and for example, the operation device 21 is a mouse and keyboard. When the user operates on the display device 20 using the operation device 21, various types of information are input to the integrated control unit C0 or output from the integrated control unit C0.

The integrated control unit C0 includes and controls a scan signal control unit C1, a stage control unit C2, and a calculation unit C3. Therefore, in this application, the control performed by the scan signal control unit C1, the stage control unit C2 and the calculation unit C3 may be described to be performed by the integrated control unit C0. In addition, the integrated control unit C0 including the scan signal control unit C1, the stage control unit C2, and the calculation unit C3 may be regarded as one control unit, and the integrated control unit C0 may be simply referred to as the "control unit".

The scan signal control unit C1 is electrically connected to the electron gun 3, the condenser lens 4, the deflection coil 5, and the objective lens 6 and controls operations thereof. The electron gun 3 receives a control signal from the scan signal control unit C1 to generate the electron beam EB1, and the electron beam EB1 is emitted toward the sample SAM.

The condenser lens 4, the deflection coil 5 and the objective lens 6 each receive a control signal from the scan signal control unit C1 to excite a magnetic field. By the magnetic field of the condenser lens 4, the electron beam EB1 is focused to have an appropriate beam diameter. By the magnetic field of the deflection coil 5, the electron beam EB1 is deflected and scanned two-dimensionally on the sample SAM. By the magnetic field of the objective lens 6, the electron beam EB1 is focused again on the sample SAM.

Further, by controlling the objective lens 6 by the scan signal control unit C1 and adjusting the excitation intensity of the objective lens 6, it is possible to focus the electron beam EB1 on the sample SAM.

The stage control unit C2 is electrically connected to the stage control device 10 and controls the operation of each drive mechanism included in the stage control device 10, and has the function of constantly linking the field of view and the coordinates of the stage 9.

The calculation unit C3 includes an image acquisition unit C4, an image combining unit C5, an instruction input unit C6, a storage unit C7, and a pattern shape analysis unit C8.

The image acquisition unit C4 is electrically connected to the detector 11 to control an operation thereof. Further, the image acquisition unit C4 can process the secondary electron EM2 detected by the detector 11 as a signal and convert the signal into a captured image (image data). The captured image is output to the display device 20, and the user can check the captured image on the display device 20.

The image combining unit C5 can combine the captured images acquired by the image acquisition unit C4 to generate a wide-area image as shown in FIG. 6, which will be described below, for example. The wide-area image is output to the display device 20, and the user can check the wide-area image on the display device 20.

The instruction input unit C6 receives the information input to the display device 20 by the user through the operation device 21. The storage unit C7 can store the information such as the coordinates of the stage 9, the acquired captured image (image data), and the like. It is to be noted that each piece of information is associated with each other.

The pattern shape analysis unit C8 has a function of analyzing a plurality of pattern shapes included in the sample SAM.

The calculation unit C3 can execute calculations related to stage coordinates, pattern shape analysis, depth information of a multilayer structure, and the like, which will be described below, using the information received by the instruction input unit C6 and the information stored in the storage unit C7.

<Configuration of Sample SAM>

Figure 2B:
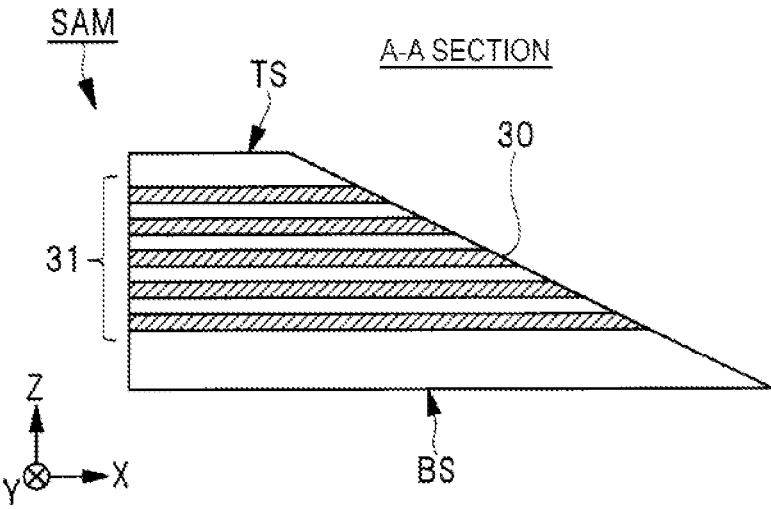
FIG. 2B is a cross-sectional view of the sample in the first embodiment.
Figure 2C:
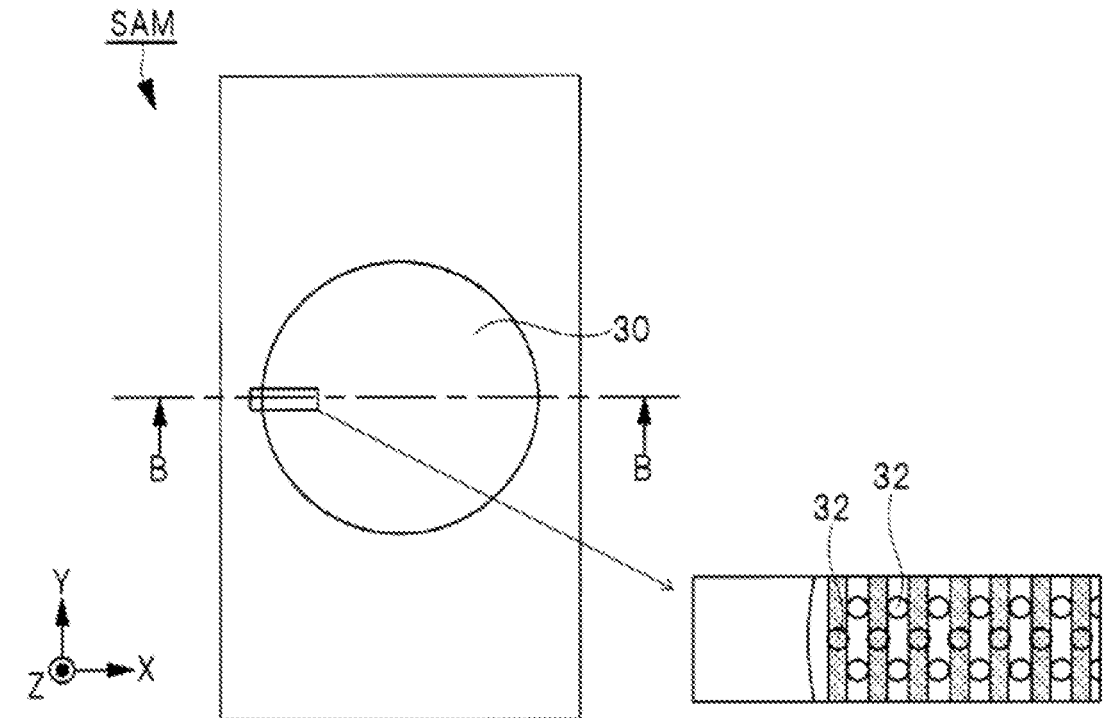
FIG. 2C is a plan view of the sample in the first embodiment.
Figure 2D:
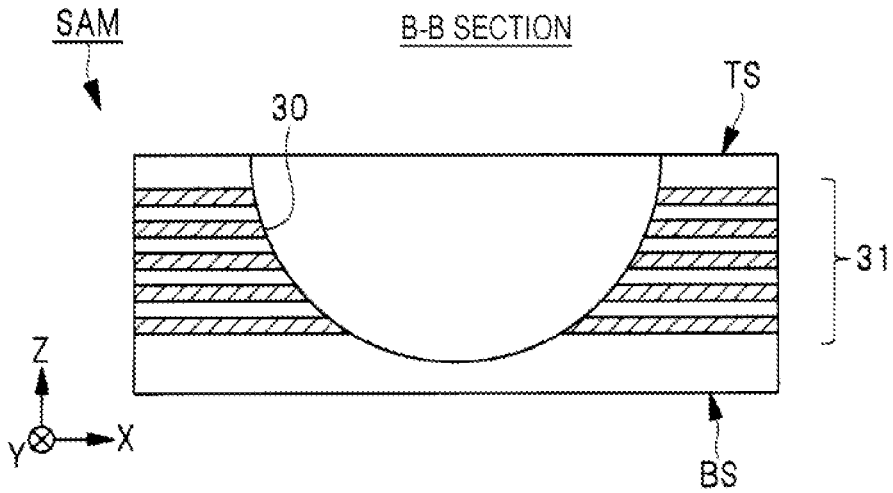
FIG. 2D is a cross-sectional view of the sample in the first embodiment.

FIGS. 2A and 2C are plan views of the sample SAM in the first embodiment. FIG. 2B is a cross-sectional view of the sample SAM taken along the line A-A in FIG. 2A in an observation surface 30. FIG. 2D is a cross-sectional view of the sample SAM taken along the line B-B of FIG. 2C in the observation surface 30.

For example, the sample SAM in the first embodiment is a slice acquired from a part of a wafer on which various semiconductor devices are formed. Therefore, the sample SAM includes a semiconductor substrate, a semiconductor element such as a transistor formed on the semiconductor substrate, a highly integrated large-scale integrated circuit (LSI) device including a plurality of transistors, a multilayer wiring layer including a plurality of gate electrodes, interlayer insulating films formed therebetween, and the like.

The sample SAM includes an upper surface TS and a lower surface BS opposite to the upper surface TS. A part of the sample SAM is polished by a polishing device such as an ion milling device, an FIB, or a dimple grinder. FIGS. 2A and 2B show views of the sample polished by the ion milling device or the FIB. FIGS. 2C and 2D show views of the sample SAM polished by the ion milling device or the dimple grinder.

As shown in FIGS. 2A, 2B, 2C, and 2D, by this polishing process, the observation surface 30 (polished surface) forming an inclined surface is formed on a part of the upper surface TS of the sample SAM.

In addition, FIGS. 2A and 2C show enlarged views of a part of the sample SAM including the observation surface 30. A plurality of patterns 32 are included in the sample SAM. For example, each of the plurality of patterns 32 is a semiconductor device having a columnar structure extending in the Z direction. In addition, for example, each of the plurality of patterns 32 is a structure such as an LSI wiring, a transistor having a multilayer structure, or like.

FIGS. 2B and 2D illustrate, as a multilayer structure 31, a plurality of conductor layers such as the multilayer wiring layer. That is, the sample SAM includes, as the multilayer structure 31, a plurality of conductor layers stacked in the first direction (Z direction), which is the direction from the upper surface TS of the sample SAM to the lower surface BS of the sample SAM. In addition, although not shown in detail, the multilayer structure 31 is formed around the plurality of patterns 32.

In the cross-sectional view, the observation surface 30 is inclined from the upper surface TS of the sample SAM toward the lower surface BS of the sample SAM. More specifically, in the cross-sectional view, the observation surface 30 forms an inclined surface that is continuously inclined from the upper surface TS toward the lower surface BS. The polishing process by the polishing device is performed such that all layers of the multilayer structure 31 are polished, and the bottom of the observation surface 30 is located deeper than the bottom layer of the multilayer structure 31. Therefore, all layers of the multilayer structure 31 are exposed on the observation surface 30 and the section.

<Analysis System>

The analysis system in the first embodiment will be described below while comparing steps S1 to S16 shown in the flowchart of FIG. 3 with FIGS. 4 to 10.

Further, as described below, the analysis system includes, as a method for measuring the sample SAM, steps performed in the polishing device, steps performed in the sample preparation device, and steps performed in the charged particle beam device 1. Therefore, not only the charged particle beam device 1, but also those polishing devices and sample preparation devices form a part of the analysis system.

In step S1, preparation of the sample SAM is performed. First, the sample SAM is prepared by cutting out a part of a wafer using a sample preparation device such as a diamond cutter. Then, the cut sample SAM is transferred from the sample preparation device to the polishing device. For example, the polishing device is an ion milling device, an FIB, a dimple grinder, or the like.

Then, using the polishing device, the upper surface TS of the sample SAM is subjected to the polishing process, and accordingly, the observation surface 30 is formed on a part of the upper surface TS. Then, the sample SAM after the polishing process is transferred from the polishing device to the sample preparation device. For example, the sample preparation device is the FIB or the ion milling device.

Then, the sample SAM shown in FIG. 2B or FIG. 2D is prepared by sectioning the sample SAM in the observation surface 30 with the sample preparation device. Then, the sectioned sample SAM is mounted on the sample table 8.

Hereinafter, an example of using the sample SAM shown in FIGS. 2A and 2B will be described, but the same method can also be performed when using the sample SAM shown in FIGS. 2C and 2D.

In step S2, the sample SAM is installed. First, the sample table 8 on which the sample SAM is mounted is transferred from the sample preparation device to the charged particle beam device 1. Then, the sample table 8 on which the sample SAM is mounted is placed on the stage 9 such that the upper surface TS of the sample SAM faces the electron gun 3. As a result, the upper surface TS including the observation surface 30 is disposed perpendicular to the Z direction.

In step S3, the application is activated. The application is activated by the user operating on the display device 20 using the operation device 21. Upon activation of the application, an operation screen 40a is displayed on the display device 20 as shown in FIG. 4. The operation screen 40a is mainly used for the user to input instructions to the integrated control unit C0 and for the user to obtain various pieces of information from the integrated control unit C0.

On the operation screen 40a, the user can switch between a display unit 41 for capturing a wide-area image, a display unit 42 for acquiring depth information, and a display unit 70 for pattern analysis.

The display unit 41 for capturing a wide-area image includes a captured image display unit 43, a condition display unit 44, a capture button B1, a reference button B2, a positioning tool add button B3, and a wide-area image generation start button B4.

The capture button Bl is used when irradiating the sample SAM with the electron beam EB1 and acquiring a captured image. The reference button B2 is used when outputting a captured image captured beforehand to the captured image display unit 43. The positioning tool add button B3 is used when adding an observation range 45 which will be described below. The wide-area image generation start button B4 is used when performing continuous capturing in order to generate a wide-area image in step S6 which will be described below.

The condition display unit 44 displays capturing conditions such as start point coordinates, end point coordinates, magnification, and the number of sheets. Further, the condition display unit 44 includes a button B5 for determining capturing conditions and a button B6 for setting further details of the capturing conditions.

In step S4, alignment and acquisition of an entire image, which is a captured image viewed from the first direction (Z direction), are performed. First, the user performs alignment including focusing of the electron beam EB1 on the sample SAM, changing the magnification, and the like. Then, when the user clicks the capture button Bl, the sample SAM is irradiated with the electron beam EB1 from the first direction (Z direction), and an entire image including the observation surface 30 is acquired.

As shown in FIG. 4, the acquired entire image viewed from the first direction (Z direction) is output from the integrated control unit C0 to the captured image display unit 43. This allows the user to check the outline of the sample SAM.

In step S5, the capturing conditions are set. First, as shown in FIG. 5, on the captured image display unit 43, the user drags the mouse which is the operation device 21, for example, so as to specify the observation range 45 on the entire image including the observation surface 30. The integrated control unit C0 converts the specified observation range 45 into the position coordinates of the sample SAM, and outputs, to the condition display unit 44, the start point coordinates and the end point coordinates.

In this case, the user can click the positioning tool add button B3 to additionally specify the observation range 45. For example, it is possible to add another observation range 45 displaced in the Y direction with respect to the initially selected observation range 45.

Then, the user inputs, in the condition display unit 44, the capturing conditions such as the magnification and the number of sheets, and clicks the wide-area image generation start button B4. The integrated control unit C0 receives the input capturing conditions and starts continuous capturing to generate a plurality of captured images of the sample SAM viewed from the first direction (Z direction).

In step S6, the user clicks the button B4 to acquire a wide-area image, which is a captured image of the sample SAM viewed from the first direction (Z direction). First, the upper surface TS (the observation surface 30) of the sample SAM placed on the stage 9 is irradiated with the electron beam EB1 in the first direction (Z direction).

Then, in the detector 11, the secondary electron EB2 emitted from the sample SAM is detected as a signal. Then, in the image acquisition unit C4 of the integrated control unit C0, a captured image viewed from the first direction (Z direction) is acquired based on the detected signal. A plurality of captured images are acquired by sequentially performing the above operations on the observation target within the observation range 45.

Then, as shown in FIG. 6, the image combining unit C5 of the integrated control unit C0 combines the plurality of captured images acquired in step S5 with each other to generate a wide-area image viewed from the first direction (Z direction). The generated wide-area image is output to the captured image display unit 43.

That is, the integrated control unit C0 acquires a plurality of captured images and wide-area images based on the signal detected by the detector 11.

In addition, the integrated control unit C0 can associate the coordinates of the captured image with the coordinates of the stage 9. Therefore, the user can check the coordinate information and the like of the target observation position. In addition, these coordinates are stored in the storage unit C7 of the integrated control unit C0.

Further, in step S6, it is assumed that the wide-area image is generated, but depending on the samples, it may not be necessary to generate the wide-area image, and only one or several portions may be captured. In this case, only the start point coordinates are displayed in the condition display unit 44, and the end point coordinates are not displayed. The following description of generating a wide-area image also includes the case of capturing at one or several portions.

In step S7, reference coordinates are specified. First, as shown in FIG. 6, the user clicks a first portion of the multilayer structure 31 exposed on the observation surface 30 in the captured image display unit 43. For example, the first portion is the first layer of the multilayer structure 31. As a result, the integrated control unit C0 specifies the first portion in the wide-area image as reference coordinates (x1, y1) 46a viewed from the first direction (Z direction). The specified reference coordinates (x1, y1) 46a are stored in the storage unit C7.

It is to be noted that, in the present application, the first layer of the multilayer structure 31 refers to a layer that is closest to the upper surface TS of the sample SAM and that corresponds to the top layer of the multilayer structure 31. In the following description, this applies when "the first layer of the multilayer structure 31" is used.

In addition, as shown in FIG. 6, for a sample that allows a clear observation of a multilayer structure, it is easy to specify, as the reference coordinates, a suitable layer as the start point, such as the first layer of the multilayer structure. However, it is also assumed that, depending on the samples, the multilayer structure cannot be clearly observed. In that case, for example, the position of a specific pattern or the position of a structure having another shape can also be specified as the reference coordinates (x1, y1) 46*a*.

In step S8, the sample SAM is inclined. A control signal is transmitted from the stage control unit C2 of the integrated control unit C0 to the stage control device 10 to drive the T-axis drive mechanism of the stage control device 10. That is, the stage control device 10 is controlled to tilt the stage 9 on which the sample SAM is placed such that the section of the sample SAM faces the electron gun 3 in the second direction intersecting the first direction. As a result, the user can observe the section of the sample SAM from the second direction (Y direction). In this case, the stage 9 is inclined by 90 degrees, and the first direction (Z direction) is perpendicular to the second direction (Y direction).

It is to be noted that although the first direction is the Z direction and the second direction is the Y direction herein, the first direction and the second direction are not limited to the Z direction and the Y direction, and may be directions intersecting each other.

Further, depending on the performance of the charged particle beam device 1, the drive range of the T-axis drive mechanism of the stage control device 10 may be less than 90 degrees. In this case, the user takes out the sample table 8 on which the sample SAM is mounted from the sample chamber 7, removes the sample SAM from the sample table 8, mounts the sample SAM on the sample table 8 again with the sample SAM inclined 90 degrees, and returns the sample table 8 with the sample SAM mounted thereon to the sample chamber 7.

In step S9, alignment and acquisition of a sectional image, which is a captured image of the sample SAM viewed from the second direction (Y direction), are performed by the same method as in step S4. The acquired sectional image is output from the integrated control unit C0 to the captured image display unit 43.

In step S10, the reference coordinates are linked. First, on the operation screen 40*a*, the user switches from the display unit 41 for capturing a wide-area image to the display unit 42 for acquiring depth information.

As shown in FIG. 7, like the display unit 41 for capturing a wide-area image, the display unit 42 for acquiring depth information includes the captured image display unit 43, the capture button B1, the reference button B2, and the positioning tool add button B3. Further, a movement condition display unit 47 and a layer information display unit 48 are provided in the display unit 42 for acquiring depth information.

The movement condition display unit 47 includes a button B7 for moving to the reference position, a button B8 for linking with the first direction, and a button B9 for moving to the X coordinate. The layer information such as the number of layers, the thickness of one layer, and the depth at which the first layer starts, and the like can be displayed on the layer information display unit 48.

As shown in FIG. 7, the captured image display unit 43 displays the sectional image of the sample SAM viewed from the second direction (Y direction) which is acquired in step S9. When the user clicks the button B7, the stage control unit C2 of the integrated control unit C0 moves the stage control device 10 such that the stage 9 is positioned at a X coordinate x1 of the reference coordinates (x1, y1) 46*a*. An X-coordinate position 49 of the stage 9 after movement is displayed on the captured image display unit 43.

Then, the user carries out a click operation on the multilayer structure 31 at a position overlapping with the X-coordinate position 49 in the captured image display unit 43, thereby specifying a Z-coordinate z1 serving as a reference in the second direction (Y-direction). That is, the user carries out the click operation on a second portion of the multilayer structure 31 that is exposed on the observation surface 30 in the sectional image and that corresponds to the coordinate x1 of the reference coordinates (x1, y1) 46*a*, thereby specifying a reference Z coordinate z1 in the second direction (Y direction).

Then, when the user clicks the button B8, the integrated control unit C0 specifies the second portion in the sectional image as the reference coordinates (x1, z1) 46*b*, and associates the reference coordinates (x1, y1) 46*a* with the reference coordinates (x1, z1) 46*b*. In addition, the reference coordinates (x1, z1) 46*b* and the correspondence between the reference coordinates (x1, y1) 46*a* and (x1, z1) 46*b* is stored in the storage unit C7.

In step S11, specifying observation coordinates (x2, y2) 46*c* and moving the stage 9 are performed. First, for example, when the user clicks the reference button B2, the integrated control unit C0 causes the captured image display unit 43 to display the wide-area image (FIG. 6) viewed from the first direction (Z direction) which is acquired in step S6.

Then, the user clicks a third portion of the multilayer structure 31 exposed on the observation surface 30 in the captured image display unit 43. The third portion is a portion different from the first portion described above, and for example, the third portion is a layer different from the first layer of the multilayer structure 31. As a result, the integrated control unit C0 specifies the third portion in the wide-area image as the observation coordinates (x2, y2) 46*c* viewed from the first direction (Z direction).

As shown in FIG. 8, the integrated control unit C0 causes the movement condition display unit 47 to display a X coordinate x2 of the specified observation coordinates (x2, y2) 46*c*. Then, when the user clicks the button B9 for moving, the stage control unit C2 of the integrated control unit C0 moves the stage control device 10 such that the stage 9 is positioned at the X coordinate x2 of the observation coordinates (x2, y2) 46*c*.

FIG. 9 shows the operation screen 40*a* after the stage 9 is moved in FIG. 8. As shown in FIG. 9, the X-coordinate position 49 of the stage 9 after movement is displayed on the captured image display unit 43.

Then, the user carries out a click operation on the multilayer structure 31 at a position overlapping with the X-coordinate position 49 in the captured image display unit 43, thereby specifying a Z coordinate z2. That is, the user carries out a click operation on a fourth portion of the multilayer structure 31 that is exposed on the observation surface 30 in the sectional image and that corresponds to the coordinate x2 of the observation coordinates (x2, y2) 46*c*, thereby specifying the Z coordinate z2.

The integrated control unit C0 specifies the fourth portion in the sectional image as observation coordinates (x2, z2) 46*d*. In addition, the observation coordinates (x2, y2) 46*c* and the correspondence between the observation coordinates (x2, y2) 46*c* and the observation coordinates (x2, z2) 46*d* are stored in the storage unit C7.

Then, when the user clicks the button B9, the integrated control unit C0 moves the stage 9 toward the specified observation coordinates (x2, z2) 46*d*.

In step S12, alignment is performed. In order to observe the target observation coordinates (x2, z2) 46d in detail, the user adjusts the focus and changes the magnification of the electron beam EB1 on the sample SAM.

In step S13, a captured image viewed from the second direction (Y direction) is acquired. After step S12, when the user clicks the capture button B1, an image is captured and the captured image viewed from the second direction (Y direction) is acquired. The acquired captured image is stored in the storage unit C7.

It is to be noted that steps S12 and S13 are not essential from the viewpoint of acquiring the depth information of the multilayer structure 31, and may be omitted.

In step S14, the depth information of the multilayer structure 31 is acquired. When the user clicks a depth information acquire button B10, the calculation unit C3 of the integrated control unit C0 calculates the depth (distance in the Z direction) of the observation coordinates (x2, z2) 46d from the reference coordinates (x1, z1) 46b.

The user input, to the layer information display unit 48, the sample SAM information including the number of layers of the multilayer structure 31, the thickness of one layer or each layer of the multilayer structure 31, the depth at which the first layer of the multilayer structure 31 starts, and the like.

Further, by comparing the input information with the calculation result of the depth of the observation coordinates (x2, z2) 46d from the reference coordinates (x1, z1) 46b, the calculation unit C3 of the integrated control unit C0 calculates the number of layers of the observation coordinates (x2, z2) 46d from the reference coordinates (x1, z1) 46b.

In this case, when the reference coordinates (x1, z1) 46b are located on the first layer of the multilayer structure 31, the calculation unit C3 of the integrated control unit C0 calculates the depth and the number of layers of the observation coordinates (x2, z2) 46d from the upper surface TS of the sample SAM. That is, the order of layer of the multilayer structure 31 on which the observation coordinates (x2, z2) 46d is located is calculated.

In this way, the depth information of the multilayer structure 31 is acquired using the wide-area image and the sectional image. That is, the depth information of the multilayer structure 31 includes the depth and the number of layers of the observation coordinates (x2, z2) 46d from the reference coordinates (x1, z1) 46b and the depth and the number of layers of the observation coordinates (x2, z2) 46d from upper surface TS of sample SAM. In addition, these pieces of information are stored in the storage unit C7.

Then, in step S15, it is determined whether another observation coordinate is to be observed. If no other observation coordinates are to be observed (NO), the operation moves to step S16. If another observation coordinate is to be observed (YES), steps S11 to S14 are repeated. The integrated control unit C0 can add nanometer-order depth information to all of the target observation coordinates.

Further, each coordinate and depth information of the multilayer structure 31 acquired in steps S1 to S15 are recorded as a record table as shown in FIG. 10 and stored in the storage unit C7.

As described above, according to the technique disclosed in the first embodiment, the wide-area image viewed from the first direction (Z direction) and the sectional image viewed from the second direction (Y direction) are used such that the respective coordinates are linked, and the stage 9 is moved from the reference coordinates to the observation coordinates, such that the depth information of the multilayer structure 31 can be obtained. Then, the user can directly obtain the depth information of the multilayer structure 31 on the order of nanometers.

Examples of the other method for acquiring the depth information of the multilayer structure 31 include a method using FIB or a method of estimating the inclination angle of the polished surface, but the method using FIB has problems such as a narrow processing area, long time for evaluation, and difficulty in re-acquiring data, and the method of estimating the inclination angle of the polished surface has problems such as low depth information accuracy.

The analysis system in the first embodiment enables operation in a wider area and in a shorter time than the method using FIB, and ease of data re-acquisition. Further, the analysis system in the first embodiment can obtain more accurate depth information than the method of predicting the inclination angle of the polished surface. That is, the analysis system in the first embodiment can acquire the depth information of the multilayer structure 31 quickly and with high accuracy.

In step S16, analyzing the plurality of patterns 32 included in the sample SAM is performed. First, on the operation screen 40a, the user switches from the display unit 42 for acquiring depth information to the display unit 70 for pattern analysis.

As shown in FIG. 11, the display unit 70 for pattern analysis includes the captured image display unit 43, an image read setting unit 71, a pattern detect button B19, and a pattern analysis button B20. Further, the image read setting unit 71 includes a read button B17 and a reference button B18.

In the image read setting unit 71, when the user inputs the number of layers or the depth of the sample SAM and clicks the read button B17, the integrated control unit C0 captures an image at the observation coordinates (x3, y3, z3) 46e, which is the input position based on the depth information of the multilayer structure 31 acquired in step S14, and displays the captured image on the captured image display unit 43. In addition, the user can click the reference button B18 to select the captured image acquired beforehand.

Then, when the user clicks the pattern detect button B19, the integrated control unit C0 detects the plurality of patterns 32 using the image recognition technology, assigns numbers to the plurality of patterns 32, and displays the numbers on the captured image display unit 43.

Then, when the user clicks the pattern analysis button B20, the pattern shape analysis unit C8 uses the image recognition technology to automatically measure the diameter of each of the plurality of patterns 32 at the observation coordinates (x3, y3, z3) 46e. Then, the pattern shape analysis unit C8 acquires pattern shape information such as a major axis diameter, a minor axis diameter, an average diameter and a circularity of each of the plurality of patterns 32. The pattern shape information is stored in the storage unit C7.

It is to be noted that the observation coordinates (x3, y3, z3) 46e described herein indicate the coordinates of the central position of the captured image being observed. Therefore, the calculated number of layers also indicates the number of layers at the center position of the captured image being observed.

The integrated control unit C0 can record the acquired pattern shape information as a record table, and output the record table together with the observed captured image as shown in FIG. 12. In addition, such pattern shape information is associated with other information and recorded in the record table of FIG. 10.

As described above, according to the analysis system in the first embodiment, it is possible to acquire not only the depth information of the multilayer structure 31, but also the pattern shape information of the plurality of patterns 32 included in the sample SAM.

Second Embodiment

Hereinafter, an analysis system in the second embodiment will be described with reference to FIG. 13. Hereinbelow, differences from the first embodiment are mainly explained.

In the second embodiment, the timing of forming the section of the sample SAM is different from that in the first embodiment, and the section of the sample SAM is formed after acquiring the wide-area image from the first direction (Z direction), specifying the reference coordinates (x1, y1) 46a, and specifying the observation coordinates (x2, y2) 46c are performed.

The analysis system in the second embodiment will be described below using steps S21 to S40 shown in the flowchart of FIG. 13.

In step S21, the observation surface 30 of the sample SAM is formed by the same method as in step S1. At this time, the sample SAM is in the state of FIG. 2Aa or FIG. 2Ab, and a section is not formed. In this state, the sample SAM is mounted on the sample table 8.

In steps S22 to S27, the same operations as in steps S2 to S7 are performed. The wide-area image of the sample SAM viewed from the first direction (Z direction) is acquired by the integrated control unit C0, and the reference coordinates (x1, y1) 46a are specified in the wide-area image.

In step S28, the observation coordinates (x2, y2) 46c are specified prior to specifying the reference coordinates (x1, z1) 46b. That is, after specifying the reference coordinates (x1, y1) 46a shown in FIG. 6, the observation coordinates (x2, y2) 46c shown in FIG. 8 are specified.

In step S29, the sample SAM is taken out. First, the sample SAM is taken out from the sample chamber 7 and then the sample SAM is removed from the sample table 8. Then, the sample SAM is transferred to the sample preparation device such as the FIB or ion milling device.

In step S30, a section is formed. The sample SAM shown in FIG. 2B or FIG. 2D is prepared by sectioning the sample SAM in the observation surface 30 with the sample preparation device.

Hereinafter, an example of using the sample SAM shown in FIGS. 2A and 2B will be described, but the same method can also be performed when using the sample SAM shown in FIGS. 2C and 2D.

In step S31, the sample SAM is mounted on the sample table 8 such that the section is irradiated with the electron beam EB. First, the sectioned sample SAM is mounted on the sample table 8. Then, the sample table 8 is transferred to the charged particle beam device 1 and the sample table 8 is installed on the stage 9. At this time, the section of the sample SAM is disposed perpendicular to the Z direction so as to face the electron gun 3.

In step S32, the application is activated by the same method as in step S3 and the like.

In step S33, alignment and acquisition of a sectional image, which is a captured image of the sample SAM viewed from the second direction (Y direction), are performed by the same method as in step S9.

In steps S34 to S38, the same operations as in steps S10 to S14 are performed. That is, the integrated control unit C0 specifies the second portion of the multilayer structure 31 in the sectional image, which corresponds to the coordinate x1 of the reference coordinates (x1, y1) 46a, as the reference coordinates (x1, z1) 46b viewed from the second direction (Y direction). Further, the integrated control unit C0 specifies the fourth portion of the multilayer structure 31 in the sectional image, which corresponds to the coordinate x2 of the observation coordinates (x2, y2) 46c, as the observation coordinates (x2, z2) 46d viewed from the second direction (Y direction).

Then, the calculation unit C3 of the integrated control unit C0 calculates the depth and the number of layers of the observation coordinates (x2, z2) 46d from the reference coordinates (x1, z1) 46b, and calculates the depth and the number of layers of the observation coordinates (x2, z2) 46d from the upper surface TS of the sample SAM.

In step S39, as in step S15, steps S34 to S38 are repeated until observation of all observation coordinates is completed.

In this way, in the second embodiment, it is also possible to acquire the depth information of the multilayer structure 31 quickly and with high accuracy.

Moreover, when the sample SAM is first sectioned as described in the first embodiment, it is not certain whether the section corresponds to a surface from which the pattern of the multilayer structure 31 can be clearly observed. On the other hand, in the second embodiment, since the sample SAM is sectioned at a later time, it is easy to generate a surface from which the pattern of the multilayer structure 31 can be clearly observed.

Meanwhile, in the second embodiment, it is necessary to section the sample SAM in accordance with the position of the reference coordinates (x1, y1) 46a specified before the sample SAM is sectioned. However, since the accuracy depends on the performance of the sample preparation device, the sectioning position may slightly deviate from the position of the reference coordinates (x1, y1) 46a. From this point of view, the first embodiment is more suitable than the second embodiment.

In step S40, as in step S16, the plurality of patterns 32 are analyzed and the pattern shape information of the plurality of patterns 32 is acquired.

Third Embodiment

Hereinafter, an analysis system in the third embodiment will be described with reference to FIGS. 14 and 18. Hereinbelow, differences from the first embodiment are mainly explained.

In the third embodiment, a working distance (hereinafter referred to as WD), which is the distance between the objective lens 6 and the focus position, is obtained by focusing the electron beam EB1 in the first direction (Z direction) without forming a section on the sample SAM, and the depth information of the multilayer structure 31 is obtained based on the WD.

The analysis system in the third embodiment will be described below while comparing steps S41 to S56 shown in the flowchart of FIG. 14 with FIGS. 15 to 18.

In step S41, the observation surface 30 of the sample SAM is formed by the same method as in step S1. At this time, the sample SAM is in the state of FIG. 2A or 2C, and a section is not formed.

In steps S42 to S44, the same operations as in steps S2 to S4 are performed. First, the sample table 8 on which the sample SAM is mounted is placed on the stage 9 such that the upper surface TS of the sample SAM faces the electron gun 3. Then, the application is activated. Then, alignment and acquisition of an entire image, which is a captured image viewed from the first direction (Z direction), are performed.

Upon activation of the application, an operation screen 40*b* is displayed on the display device 20 as shown in FIG. 15. The operation screen 40*b* is mainly used for the user to input instructions to the integrated control unit C0 and for the user to obtain various pieces of information from the integrated control unit C0.

On the operation screen 40*b*, the user can switch between a display unit 51 for WD acquisition setting, a display unit 52 for a WD profile, a display unit 53 for observation, and the display unit 70 for pattern analysis.

The display unit 51 for WD acquisition setting includes a captured image display unit 54, a WD acquisition setting unit 55, a mode selection unit 56, the capture button B1, the reference button B2, the positioning tool add button B3, and a WD data acquisition start button B12.

The acquisition conditions such as start point coordinates, end point coordinates, magnification, and the number of WD acquisition times are displayed in the WD acquisition setting unit 55. Further, the WD acquisition setting unit 55 includes a WD acquisition condition confirm button B11. The mode selection unit 56 displays a check box for selecting a pre-scan mode or a capture mode.

When the user clicks the capture button B1, the upper surface TS of the sample SAM is irradiated with the electron beam EB1 from the first direction (Z direction), and the entire image including the observation surface 30 is acquired.

In step S45, setting the WD acquisition is performed. On the captured image display unit 43, the user drags the mouse, which is the operation device 21, for example, so as to specify the observation range 57 on the entire image including the observation surface 30.

The integrated control unit C0 converts the specified observation range 57 into the position coordinates of the sample SAM, and outputs, to the WD acquisition setting unit 55, the start point coordinates and the end point coordinates. The integrated control unit C0 receives setting details such as the number of times of WD acquisition or the WD acquisition interval, calculates the WD acquisition position, and displays the final observation range 57 on the captured image display unit 43.

In this case, the user can click the positioning tool add button B3 to additionally specify the observation range 57. For example, it is possible to add another observation range 57 displaced in the Y direction with respect to the initially selected observation range 57. In this case, since a plurality of WD profiles to be described below are generated, by comparing the plurality of WD profiles with each other, it is possible to acquire more accurate depth information of the multilayer structure 31.

Further, the user can select the pre-scan mode or the capture mode in the mode selection unit 56. In both the pre-scan mode and the capture mode, within the specified observation range 57, focusing the electron beam EB1 in the first direction (Z direction) is performed using the objective lens 6 with respect to a plurality of observation points, which are target positions in the sample SAM.

In the pre-scan mode, the initial observation point is automatically focused and the corresponding data is stored in the recording unit C7, and the stage 9 is moved to the next observation point and focusing is performed automatically for the next observation point. That is, the pre-scan mode is a mode of repeating focusing without acquiring a captured image and storing the WD value. In this case, the captured image is acquired after the WD profile is generated.

In the capture mode, focusing and acquiring a captured image of an initial observation point are automatically performed, and the corresponding data is stored in the recording unit C7. Then, the stage 9 is moved to the next observation point, and for the next observation point, focusing and acquiring a captured image are automatically performed. That is, the capture mode is a mode of acquiring the captured image viewed from the first direction (Z direction) together with focusing, and storing the WD value.

When the user clicks the WD data acquisition start button B12, the integrated control unit C0 starts acquiring the WD values within the observation range 57 in the pre-scan mode or the capture mode.

In step S46, the stage control unit C2 of the integrated control unit C0 moves the stage control device 10 and the stage 9 to the start point coordinates of the observation range 57.

In step S47, the scan signal control unit C1 of the integrated control unit C0 irradiates the upper surface TS of the sample SAM with the electron beam EB1 from the first direction (Z direction), and performs focusing on the start point coordinates of the observation range 57 using the objective lens 6.

In step S48, determining a mode is performed. When the pre-scan mode is selected, the subsequent step is step S50, and when the capture mode is selected, the next step is step S49.

In the capture mode of step S49, acquiring a captured image and focusing are performed together.

In step S50, a calculation unit C13 of the integrated control unit C0 acquires information on the x-coordinate, y-coordinate, and WD, which is the distance between the objective lens 6 and the focus position, for a point at which focusing is performed. The acquired information is stored in the storage unit C7.

In step S51, the stage 9 is moved to the next observation point, and the next observation point is automatically focused. Then, steps S47 to S51 are repeated until information such as the WD at all target observation points is acquired.

In steps S52 and S53, first, as shown in FIG. 16, on the operation screen 40*b*, the user switches from the display unit 51 for WD acquisition setting to the display unit 52 for a WD profile.

The display unit 52 for a WD profile includes the captured image display unit 54, a layer information display unit 58, and a WD profile acquire button B13.

In step S52, the information of the sample SAM is input. The user input, to the layer information display unit 58, the sample SAM information including the number of layers of the multilayer structure 31, the thickness of one layer or each layer of the multilayer structure 31, the depth at which the first layer of the multilayer structure 31 starts, and the like. The calculation unit C3 of the integrated control unit C0 associates the sample SAM information input by the user with the WD information at all observation points.

In step S53, a WD profile is generated. First, as shown in FIG. 17, on the operation screen 40*b*, the user switches from the display unit 52 for a WD profile to the display unit 53 for observation.

The display unit 53 for observation includes the captured image display unit 54, an observation position selection unit 59, an observation condition setting unit 60, the WD profile acquire button B13, and a capture button B14.

When the user clicks the WD profile acquire button B13, the integrated control unit C0 generates a WD profile by graphing the distance WD between the objective lens 6 and the focus position at a plurality of observation points of the sample SAM. In addition, areas other than the observation surface 30 are drawn in a flat line in the WD profile. Therefore, the user can determine that the flat line corresponds to the upper surface TS of the sample SAM.

The calculation unit C3 of the integrated control unit C0 can acquire the depth information of the multilayer structure 31 included in the sample SAM by comparing the sample SAM information input by the user (the number of layers of the multilayer structure 31, the thickness of one layer or the thickness of each layer of the multilayer structure 31, the depth at which the first layer of the multilayer structure 31 starts, and the like) with the WD profile.

That is, it is possible to know how deep a predetermined position on the WD profile is from the upper surface TS of the sample SAM and the order of layers of the multilayer structure 31 corresponding to the predetermined position. In other words, the depth information of the multilayer structure 31 includes the depth and the number of layers of a predetermined position on the WD profile from the upper surface TS of the sample SAM.

It is to be noted that, depending on the sample SAM, the observation surface 30 formed by the polishing process may not have the desired surface shape. For example, the observation surface 30 may have irregularities. In this case, with the WD profile generated, the user can quickly determine whether the shape of the observation surface 30 is successful or not. For example, when the difference in the irregularities of the observation surface 30 is large, the user can use another observation range 57 that is added using the positioning tool add button B3.

In step S54, determining a mode is performed. When the pre-scan mode is selected, the next step is step S55, and when the capture mode is selected, the next step is step S56.

In the pre-scan mode of step S55, a captured image can be generated at a desired portion of the sample SAM.

For example, as shown in FIG. 17, in the observation condition setting unit 60, the user first sets various observation conditions. Then, the user selects "select from a WD profile" in the observation position selection unit 59. Then, the user specifies a predetermined position in the WD profile. Then, when the user clicks the capture button B14, a portion of the sample SAM corresponding to the specified predetermined position is irradiated with the electron beam EB1 from the first direction (Z direction), such that a captured image of the sample SAM viewed from the first direction (Z direction) is acquired.

It is to be noted that the capturing refers to continuous capturing, in which a plurality of captured images can be acquired by continuously capturing the observation range 57, and a wide-area image can be acquired by combining the plurality of captured images.

In addition, as another method of acquiring a captured image, the user can select the "number of layers from the surface" or the "depth from the surface" in the observation position selection unit 59, thereby acquiring a captured image for the portion input thereto.

Meanwhile, in step S49 or step S55, when observing or capturing the image from the first direction (Z direction), it is necessary to consider a situation where there is a foreign matter on the upper surface TS of the sample SAM and the pattern of the multilayer structure 31 cannot be detected accurately.

In this case, for the samples shown in FIGS. 2A and 2B, it is possible to observe the pattern of the multilayer structure 31 at another position free of foreign matter by maintaining the x-coordinate of the position of the foreign matter, moving to another y-coordinate position, and acquiring a captured image while displacing the x-coordinate by several points at a position considered to be at the same depth.

In addition, in the samples shown in FIGS. 2C and 2D, since the observation surface 30 is roughly symmetrical with respect to the Z-axis, it is assumed that a WD at a certain depth is acquired at two portions. In this case, it is possible to observe the target pattern by specifying the same depth location on the WD profile.

Furthermore, in the samples shown in FIGS. 2A and 2C or FIGS. 2B and 2D, when the WD is acquired not only for one column but also for the entire observation surface 30, a 3D WD profile can be acquired. Therefore, by displaying a 3D WD profile on the captured image display unit 54 and indicating the portions with the same depth specified by the user in colors, for example, the user is enabled to select a different position and capture another pattern 32.

In particular, when a mechanical polishing device such as a dimple grinder is used instead of the ion milling device or FIB for the polishing process for forming the observation surface 30, the foreign matter is more likely to occur on the observation surface 30. However, even in such a case, the pattern of the multilayer structure 31 can be observed at another location where there is no foreign matter, as described above.

In addition, by observing a plurality of locations at the same depth on the WD profile, it is possible to compare the differences in pattern shape at the plurality of locations.

Further, each coordinate and depth information of the multilayer structure 31 acquired in steps S41 to S55 are recorded as a record table as shown in FIG. 18 and stored in the storage unit C7. The integrated control unit C0 can acquire the depth and the number of layers at a predetermined position from the upper surface TS of the sample SAM by performing calculations based on the predetermined position on the WD profile.

As described above, the analysis system in the third embodiment is also capable of acquiring 3D information of the sample SAM on the order of nanometers, and acquiring the depth information of the multilayer structure 31 quickly and with high accuracy.

In step S56, the plurality of patterns 32 are analyzed in the same manner as in step S16. First, as shown in FIG. 19, on the operation screen 40*b*, the user switches from the display unit 53 for observation to the display unit 70 for pattern analysis. The operation performed on the display unit 70 for pattern analysis is the same as with the method described in step S16.

In the image read setting unit 71, when the user inputs the number of layers or the depth of the sample SAM and clicks the read button B17, the integrated control unit C0 captures an image at the observation coordinates (x3, y3, z3) 46*e*, which is the input position based on the depth information of the multilayer structure 31 acquired in step S53, and displays the captured image on the captured image display unit 43. In addition, the user can click the reference button B18 to select a captured image acquired beforehand.

Then, the pattern shape information of the plurality of patterns 32 can be acquired by the same method as in step S16 in the first embodiment.

Fourth Embodiment

Hereinafter, an analysis system in the fourth embodiment will be described with reference to FIGS. 20 and 22. Hereinbelow, differences from the third embodiment are mainly explained.

In the fourth embodiment, the 3D information data of the sample SAM acquired by another technique different from that of the third embodiment is compared with the WD profile, and the WD profile is corrected. Another method is a method performed in a device different from the charged particle beam device 1, such as a method performed in a surface shape measuring device 101, for example. As a result, the 3D information of the sample SAM can be acquired with higher accuracy.

The surface shape measuring device 101 shown in FIG. 20 is a white interference microscope, for example, and can acquire 3D information (e.g., positional coordinates x, y, z) of the upper surface TS of the sample SAM. The surface shape measuring device 101 includes a lens barrel 102, a stage 109, a stage control device 110, and an integrated control unit C10. The integrated control unit C10 is electrically connected to the display device 20 and the operation device 21 which are provided inside or outside the surface shape measuring device 101.

A white light source 103, a first beam splitter 104, a second beam splitter 105, an objective lens 106, a reference surface 107, and a camera 108 are provided inside the lens barrel 102.

The stage 109 and the stage control device 110 are provided outside the lens barrel 2 and stand still in the atmosphere. The sample SAM can be mounted on the stage 109. The stage control device 110 is connected to the stage 109 and can change the position and orientation of the stage 109. The displacement of the stage 109 changes the position and orientation of the sample SAM. The stage control device 110 has substantially the same mechanism as the stage control device 10 of the charged particle beam device 1.

The white light source 103 emits white light WL1. The first beam splitter 104 and the second beam splitter 105 split the emitted white light WL1 into two such that one illuminates the reference surface 107 and the other illuminates the surface of the sample SAM. A reflected light WL2 reflected from both the reference surface 107 and the sample SAM is imaged at the camera 108 for measurement. The objective lens 106 focuses the white light WL1 such that the sample SAM placed on the stage 109 is focused.

The integrated control unit C10 includes and controls an optical system control unit C11, a stage control unit C12, and the calculation unit C13. Therefore, in this application, the control performed by the scan signal control unit C11, the stage control unit C12 and the calculation unit C13 may be described to be performed by the integrated control unit C10. In addition, the integrated control unit C10 including the scan signal control unit C11, the stage control unit C12, and the calculation unit C13 may be regarded as one control unit, and the integrated control unit C10 may be simply referred to as the "control unit".

The optical system control unit C11 is electrically connected to the white light source 103, the first beam splitter 104, the second beam splitter 105, the objective lens 106, and the reference surface 107, and controls the operations thereof.

The stage control unit C12 is electrically connected to the stage control device 110 and controls the operation of each drive mechanism included in the stage control device 110.

The calculation unit C13 includes a surface information acquisition unit C14, an instruction input unit C15, and a storage unit C16.

The surface information acquisition unit C14 is electrically connected to the camera 108 and converts the reflected light WL2 detected by the camera 108 as a signal into 3D information data. That is, the 3D information data is data generated based on the reflected light WL2 reflected by the sample SAM when the sample SAM is irradiated with the white light WL1. The 3D information data is output to the display device 20, and the user can check the 3D information data on the display device 20.

The instruction input unit C15 receives information input to the display device 20 by the user using the operation device 21. The storage unit C16 can store information such as the coordinates of the stage 9 and the acquired 3D information data of the sample SAM. It is to be noted that each piece of information is associated with each other.

The analysis system in the fourth embodiment will be described below while comparing steps S61 to S80 shown in the flowchart of FIG. 21 with FIG. 22.

In step S61, the observation surface 30 of the sample SAM is formed by the same method as in step S41.

In step S62, the surface shape of the sample SAM is measured. The user sets the sample SAM on the stage 109 of the surface shape measuring device 101 and turns on the power to the surface shape measuring device 101.

The integrated control unit C10 receives a surface shape measurement instruction from the user and starts measuring the surface shape of the sample SAM. The measured surface shape of the sample SAM is stored in the storage unit C16 as 3D information data. As a result, it is also possible to determine the degree of completion of the sample SAM before inserting the sample SAM into the charged particle beam device 1.

It is to be noted that the surface shape measuring device 101 is electrically connected to the charged particle beam device 1 via a network or the like. Therefore, the acquired 3D information data can be linked with the WD and the WD profile acquired in the charged particle beam device 1.

In steps S63 to S72, the same operations as in steps S42 to S51 are performed. The sample SAM is transferred from the surface shape measuring device 101 to the charged particle beam device 1, and the integrated control unit C0 acquires WD information via an application.

In step S73, the charged particle beam device 1 reads the data (3D information data) of another method, and sets fitting conditions in step S74.

As shown in FIG. 22, an accuracy selection unit 61 is provided in the display unit 52 for a WD profile of the operation screen 40*b*. The accuracy selection unit 61 includes a check box for selecting to perform fitting with another method, as a method of selecting accuracy of acquiring depth information of the multilayer structure 31. The accuracy selection unit 61 also includes a button B15 to read data of another method, and a fitting start button B16.

When the user selects to perform fitting with another method (selects "yes") in the accuracy selection unit 61, the integrated control unit C0 receives the selection. Then, when the user clicks the button B15 to read data of another method, the integrated control unit C0 reads the data (3D information data) of another method.

In step S75, fitting between the 3D information data and the WD information is performed. When the user clicks the fitting start button B16, the integrated control unit C0 performs fitting between the read 3D information data and the WD information. In addition, examples of the fitting method include curve fitting, three-point alignment, and the like.

That is, the WD at a plurality of observation points of the sample SAM is compared with the 3D information data acquired by the surface shape measuring device 101. Then, as a result of comparison, the WD is corrected.

In this case, since the resolution of the surface shape measuring device 101 (white interference microscope) is on the order of angstrom (A), the surface shape measuring device 101 has sufficient analytical accuracy for the multilayer structure 31 of nano order. In addition, while the WD at a plurality of observation points of the sample SAM is a combination of fragment information, the 3D information data obtained by the surface shape measuring device 101 is continuous information. Therefore, by correcting the WD so as to match the more accurate 3D information data, a more accurate WD profile can be acquired.

In steps S76 to S80, the same operations as in steps S52 to S56 are performed. That is, inputting the sample SAM information, generating a WD profile, and acquiring a captured image in the pre-scan mode are performed.

It is to be noted that the WD profile in the fourth embodiment is generated by graphing the corrected WD.

As described above, the analysis system in the fourth embodiment can acquire the depth information of the multilayer structure 31 with higher accuracy than the third embodiment.

Although the present invention has been specifically described above based on the embodiments, the present invention is not limited to the embodiments described above and can be variously modified without departing from the gist thereof.

REFERENCE SIGNS LIST

1: charged particle beam device
2: lens barrel
3: electron gun
4: condenser lens
5: deflection coil
6: objective lens
7: sample chamber
8: sample table
9: stage
10: stage control device
11: detector
20: display device
21: operation device
30: observation surface (polished surface)
31: multilayer structure
32: pattern
40a, 40b: operation screen
41: display unit for capturing wide-area image
42: display unit for acquiring depth information
43: captured image display unit
44: condition display unit
45: observation range
46a: reference coordinates (x1, y1)
46b: reference coordinates (x1, z1)
46c: observation coordinates (x2, y2)
46d: observation coordinates (x2, z2)
46e: observation coordinates (x3, y3, z3)
47: movement condition display unit
48: layer information display unit
49: X-coordinate position
51: display unit for WD acquisition setting
52: display unit for WD profile
53: display unit for observation
54: captured image display unit
55: WD acquisition setting unit
56: mode selection unit
57: observation range
58: layer information display unit

59: observation position selection unit
60: observation condition setting unit
61: accuracy selection unit
70: display unit for pattern analysis
71: image read setting unit
101: surface shape measuring device
102: lens barrel
103: white light source
104: first beam splitter
105: second beam splitter
106: objective lens
107: reference surface
108: camera
109: stage
110: stage control device
B1: capture button
B2: reference button
B3: positioning tool add button
B4: wide-area image generation start button
B5: button for determining capturing conditions
B6: button for setting details of the capturing conditions
B7: button for moving to reference position
B8: button for linking with first direction
B9: button for moving to X coordinate
B10: depth information acquire button
B11: acquisition condition confirm button
B12: WD data acquisition start button
B13: WD profile acquire button
B14: capture button
B15: button to read data of another method
B16: fitting start button
B17: read button
B18: reference button
B19: pattern detect button
B20: pattern analysis button
BS: lower surface
C0: integrated control unit (control unit)
C1: scan signal control unit
C2: stage control unit
C3: calculation unit
C4: image acquisition unit
C5: image combining unit
C6: instruction input unit
C7: storage unit
C8: pattern shape analysis unit
C10: integrated control unit (control unit)
C11: optical system control unit
C12: stage control unit
C13: calculation unit
C14: surface information acquisition unit
C15: instruction input unit
C16: storage unit
EB1: electron beam
EB2: secondary electron
SAM: sample
TS: upper surface
WL1: white light
WL2: reflected light

The invention claimed is:

1. An analysis system comprising:
(a) acquiring a first captured image of a sample viewed from a first direction by irradiating the sample including a multilayer structure with an electron beam from the first direction;
(b) acquiring a second captured image of the sample viewed from a second direction by irradiating the sample with the electron beam from the second direction, in which the second direction intersects the first direction; and (c) acquiring depth information of the multilayer structure using information of the sample including the first captured image, the second captured image, a number of layers of the multilayer structure, a thickness of one layer or a thickness of each layer of the multilayer structure, and a depth at which a first layer of the multilayer structure starts;

wherein the sample includes:

an upper surface;

a lower surface opposite to the upper surface;

an observation surface formed on a part of the upper surface so as to be inclined from the upper surface toward the lower surface; and a section that is sectioned in the observation surface, and a part of the multilayer structure is exposed on the observation surface and the section, in the step (a), the upper surface is irradiated with the electron beam, and in the step (b), the section is irradiated with the electron beam;

wherein the step (c) includes:

(c1) specifying a first portion of the multilayer structure exposed on the observation surface in the first captured image as first reference coordinates (x1, y1) viewed from the first direction;

(c2) specifying a second portion of the multilayer structure which is exposed on the observation surface in the second captured image and which corresponds to a coordinate x1 of the first reference coordinates (x1, y1) as second reference coordinates (x1, z1) viewed from the second direction;

(c3) specifying a third portion of the multilayer structure exposed on the observation surface and different from the first portion in the first captured image as first observation coordinates (x2, y2) viewed from the first direction;

(c4) specifying a fourth portion of the multilayer structure which is exposed on the observation surface in the second captured image and which corresponds to a coordinate x2 of the first observation coordinates (x2, y2) as second observation coordinates (x2, z2) viewed from the second direction; and (c5) calculating a depth of the second observation coordinates (x2, z2) from the second reference coordinates (x1, z1);

wherein the depth information of the multilayer structure includes the depth of the second observation coordinates (x2, z2) from the second reference coordinates (x1, z1);

wherein the step (c) further includes:

(c6) calculating a number of layers of the second observation coordinates (x2, z2) from the second reference coordinates (x1, z1) by comparing information of the sample with a calculation result of the step (c5); and (c7) after the step (c6), when the second reference coordinates (x1, z1) are located on the first layer of the multilayer structure, calculating a depth and a number of layers of the second observation coordinates (x2, z2) from the upper surface of the sample;

wherein the depth information of the multilayer structure further includes the number of layers of the second observation coordinates (x2, z2) from the second reference coordinates (x1, z1), and the depth and the number of layers of the second observation coordinates (x2, z2) from the upper surface of the sample.

2. The analysis system according to claim 1, further comprising:

(d) preparing the sample including the upper surface and the lower surface;

(e) after the step (d), forming the observation surface on a part of the upper surface by performing a polishing process on the part of the upper surface; and (f) after the step (e), forming a section by sectioning the sample in the observation surface.

3. The analysis system according to claim 2, wherein the steps (a), (b) and (c) are performed after the steps (d), (e) and (f).

4. The analysis system according to claim 2, wherein the step (a) is performed after the steps (d) and (e), the steps (c1) and (c3) are performed after the step (a), the step (f) is performed after the steps (c1) and (c3), the step (b) is performed after the step (f), the steps (c2) and (c4) are performed after the step (b), and the step (c5) is performed after the steps (c2) and (c4).

* * * * *